(12) United States Patent
Nakagawa

(10) Patent No.: US 11,571,719 B2
(45) Date of Patent: Feb. 7, 2023

(54) NOZZLE AND A SUBSTRATE CLEANING DEVICE

(71) Applicant: EBARA CORPORATION, Tokyo (JP)

(72) Inventor: Yoichi Nakagawa, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 326 days.

(21) Appl. No.: 17/036,531

(22) Filed: Sep. 29, 2020

(65) Prior Publication Data

US 2021/0101185 A1    Apr. 8, 2021

(30) Foreign Application Priority Data

Oct. 4, 2019 (JP) .............................. JP2019-183439
Aug. 20, 2020 (JP) .............................. JP2020-139153

(51) Int. Cl.
*B08B 3/02* (2006.01)
*B05B 7/02* (2006.01)
*B05B 7/16* (2006.01)

(52) U.S. Cl.
CPC ................ *B08B 3/02* (2013.01); *B05B 7/025* (2013.01); *B05B 7/16* (2013.01); *B08B 2203/007* (2013.01)

(58) Field of Classification Search
CPC ....................................................... B08B 3/02
See application file for complete search history.

(56) References Cited

U.S. PATENT DOCUMENTS

2012/0216828 A1    8/2012    Tanaka et al.

FOREIGN PATENT DOCUMENTS

WO    2011-052111 A1    5/2011

*Primary Examiner* — Jason Y Ko
(74) *Attorney, Agent, or Firm* — Pearne & Gordon LLP

(57) ABSTRACT

A nozzle for generating fine bubbles, the nozzle including: a hollow housing; and a plurality of plates provided in the housing and partitioning the housing into a plurality of spaces, wherein an upper face or a side face of the housing is provided with an inflow port into which a gas-dissolved liquid flows and which communicates with an uppermost space of the spaces partitioned by the plate, each of the plates is provided with a plurality of through-holes, and a lower face of the housing is provided with a slit communicating with a lowermost space of the spaces partitioned by the plate.

10 Claims, 26 Drawing Sheets

NOZZLE AND A SUBSTRATE CLEANING DEVICE

CROSS REFERENCE TO RELATED APPLICATIONS

The present application claims the benefit of Japanese Patent Application No. 2019-183439, filed on Oct. 4, 2019 and Japanese Patent Application No. 2020-139153, filed on Aug. 20, 2020, the entire contents of which are incorporated herein by reference.

BACKGROUND

Technical Field

The present technology relates to a nozzle and a substrate cleaning device.

Related Art

Nozzles for generating fine bubbles (for example, microbubbles) are used in substrate processing processes. For example, in the international publication WO 2011/052111, a plurality of cylindrical injection nozzles is arranged on a header body with respect to a square substrate, and are arranged perpendicular to the moving direction of the substrate, and ozone microbubble water is sprayed from the injection nozzles to the substrate.

SUMMARY

However, the above mentioned inventions have a problem that a blank area is generated between the injection nozzles due to the uniform arrangement of the injection nozzles and uniformly spraying a liquid containing fine bubbles (for example, microbubbles) onto a sprayed target object (for example, a substrate) to be sprayed cannot be realized.

In view of the above problems, the present technology desirably provides a nozzle and a substrate cleaning device capable of improving uniformity when a liquid containing fine bubbles is sprayed on a sprayed target object (for example, a substrate) to be sprayed.

A nozzle of one embodiment is a nozzle for generating fine bubbles, the nozzle comprising: a hollow housing; and a plurality of plates provided in the housing and partitioning the housing into a plurality of spaces, wherein an upper face or a side face of the housing is provided with an inflow port into which a gas-dissolved liquid flows and which communicates with an uppermost space of the spaces partitioned by the plate, each of the plates is provided with a plurality of through-holes, and a lower face of the housing is provided with a slit communicating with a lowermost space of the spaces partitioned by the plate.

A substrate cleaning device of one embodiment includes the nozzle described above.

DETAILED DESCRIPTION

Figure 1A:
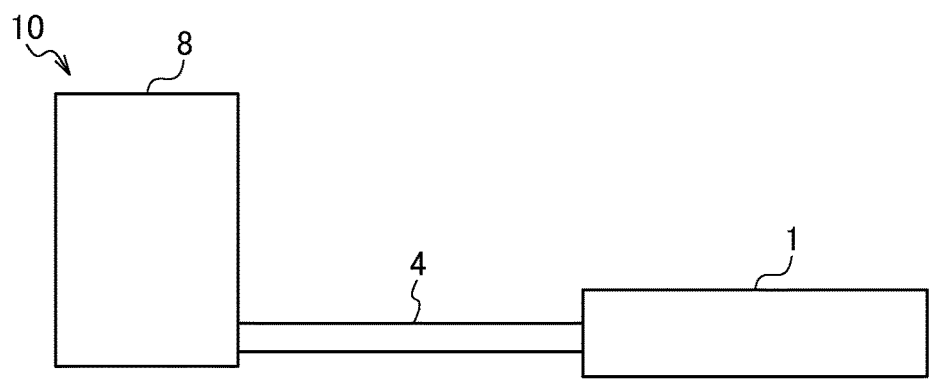
FIG. 1A is a schematic configuration diagram of a substrate cleaning device according to a first embodiment.
Figure 1A:

Hereinafter, each embodiment will be described with reference to the drawings. However, detailed explanation more than necessary may be omitted. For example, detailed explanations of already well-known matters and redundant explanation on substantially the same configuration may be omitted. This is to avoid the unnecessary redundancy of the following description and to facilitate understanding by those skilled in the art.

A nozzle according to a first aspect of one embodiment is a nozzle for generating fine bubbles, the nozzle comprising: a hollow housing; and a plurality of plates provided in the housing and partitioning the housing into a plurality of spaces, wherein an upper face or a side face of the housing is provided with an inflow port into which a gas-dissolved liquid flows and which communicates with an uppermost space of the spaces partitioned by the plate, each of the plates is provided with a plurality of through-holes, and a lower face of the housing is provided with a slit communicating with a lowermost space of the spaces partitioned by the plate.

This configuration allows the bubble to be miniaturized in the process in which the liquid and gas bubbles separated by passing through the plate 21 pass through the plate, respectively, and allows the liquid containing the fine bubbles to be generated when the liquid reaches the lowermost space of the spaces partitioned by the plate. The liquid containing the fine bubbles is discharged through the slit. Therefore, the uniformity in spraying the liquid containing the fine bubbles onto a sprayed target object (for example, a substrate) can be improved.

A nozzle according to a second aspect of one embodiment is a nozzle according to the first aspect, wherein the plurality of plates has a second plate provided below a first plate of the plurality of plates, and the second plate has a larger number of through-holes than the first plate, and/or has through-holes smaller than and equal to the first plate.

This configuration enables the bubble to be miniaturized.

A nozzle according to a third aspect of one embodiment is a nozzle according to the first or the second aspect, comprising a heating means that heats the housing or the gas-dissolved liquid.

According to this configuration, heating the liquid just before being sprayed on a sprayed target object (for example, a substrate) intentionally lowers the gas solubility, and promotes the generation of bubbles. Further, according to this configuration, the gas-dissolved liquid immediately before being supplied to the nozzle is at room temperature, for example, and easy to control the concentration. Further, in order to spray the heated liquid onto the sprayed target object (for example, the substrate) through the nozzle, the need to hold the heated gas-dissolved liquid at a high pressure is eliminated.

A nozzle according to a fourth aspect of one embodiment is a nozzle according to the third aspect, wherein the heating means is an electric heating member provided in the housing.

According to this configuration, heating the housing by the electric heating member enables the liquid passing through the nozzle to be heated.

A nozzle according to a fifth aspect of one embodiment is a nozzle according to the third aspect, wherein the heating means is an infrared ray irradiator for irradiating the housing with infrared rays.

According to this configuration, heating the housing by infrared rays enables the liquid passing through the nozzle to be heated.

A nozzle according to a sixth aspect of one embodiment is a nozzle according to the third aspect, wherein the heating means is a medium flowing in the housing and having a predetermined temperature or higher.

According to this configuration, when a medium of a predetermined temperature or higher passes through the cavity, the housing is heated, whereby the liquid passing through the nozzle can be heated.

A nozzle according to a seventh aspect of one embodiment is a nozzle according to the third aspect, wherein the heating means is a medium flowing through a surface of the housing and having a predetermined temperature or higher.

According to this configuration, the surface of the housing can be heated, and the liquid passing through the nozzle can be heated.

A nozzle according to an eighth aspect of one embodiment is a nozzle according to any one of the first to the seventh aspect, wherein the slit is provided along a longitudinal direction of the housing.

According to this configuration, a liquid containing fine bubbles is uniformly sprayed on a sprayed target object (for example, a substrate) in a row.

A nozzle according to a ninth aspect of one embodiment is a nozzle comprising: a header pipe to which a gas-dissolved liquid is supplied; a plurality of fine bubble generation nozzles for generating and discharging a liquid containing fine bubbles from the gas-dissolved liquid supplied from the header pipe; and a rectifier means that is provided with a slit and discharges the liquid discharged from the fine bubble generation nozzle from the slit.

According to this configuration,

A nozzle according to a tenth aspect of one embodiment comprising the nozzle according to any one of the first to the ninth aspect.

According to this configuration, this configuration allows the bubble to be miniaturized in the process in which the liquid and gas bubbles separated by passing through the plate 21 pass through the plate, respectively, and allows the liquid containing the fine bubbles to be generated when the liquid reaches the lowermost space of the spaces partitioned by the plate. The liquid containing the fine bubbles is discharged through the slit. Therefore, the uniformity in spraying the liquid containing the fine bubbles onto a sprayed target object (for example, a substrate) can be improved.

In order to facilitate understanding of the embodiments of the present technology, a comparative example will first be described.

First Comparative Example

Figure 14:
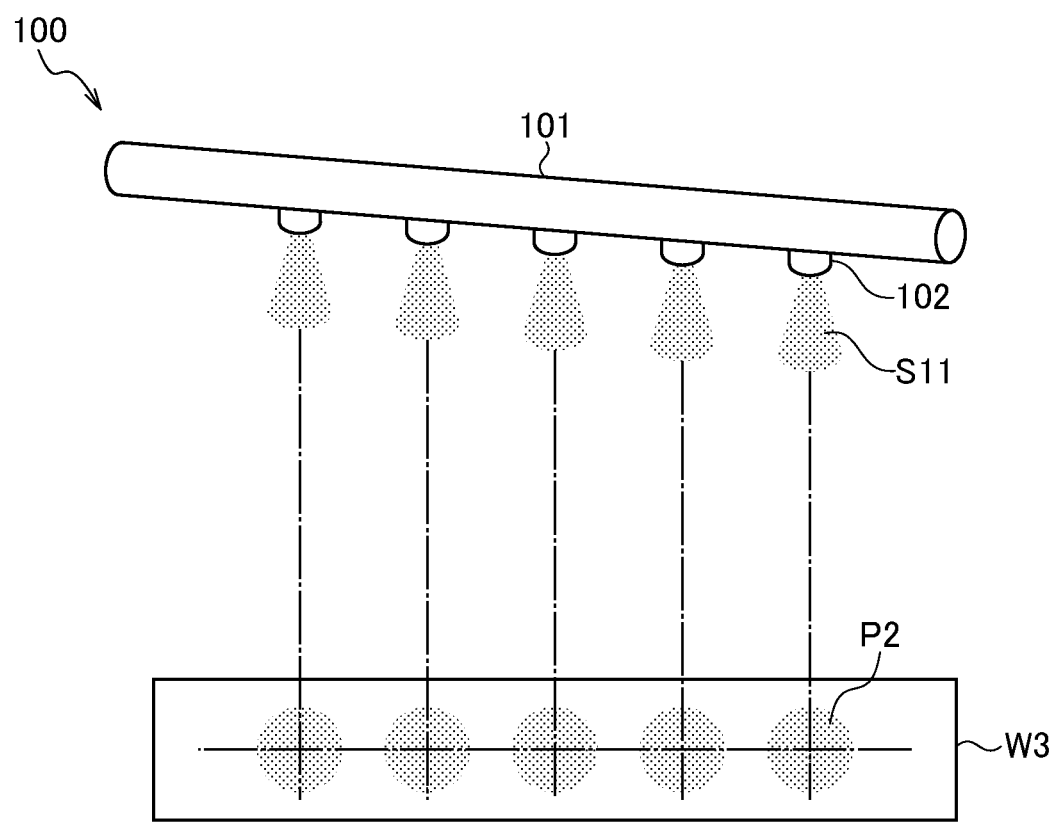
FIG. 14 is a schematic perspective view of a nozzle according to a first comparative example and a diagram illustrating a spray pattern onto a substrate.

FIG. 14 is a schematic perspective view of a nozzle according to a first comparative example and a diagram illustrating a spray pattern onto a substrate. The upper diagram in FIG. 14 is a schematic perspective view of a nozzle according to the first comparative example, and the lower diagram in FIG. 14 is a diagram illustrating a spray pattern onto a substrate. As illustrated in FIG. 14, a nozzle 100 according to the first comparative example is formed by arranging a plurality of cylindrical microbubble generation nozzles 102 on a header pipe 101. The microbubble generation nozzle 102 is a nozzle for generating microbubbles, and blows out a liquid containing the microbubbles as indicated by a blow-out region S11.

In this case, as indicated by a spray pattern P2 onto the substrate of the lower diagram in FIG. 14, the nozzle has a problem that a region in which a liquid containing microbubbles is not sprayed onto the substrate W3 occurs. The nozzle also has a problem of uneven spraying.

Second Comparative Example

Figure 15:
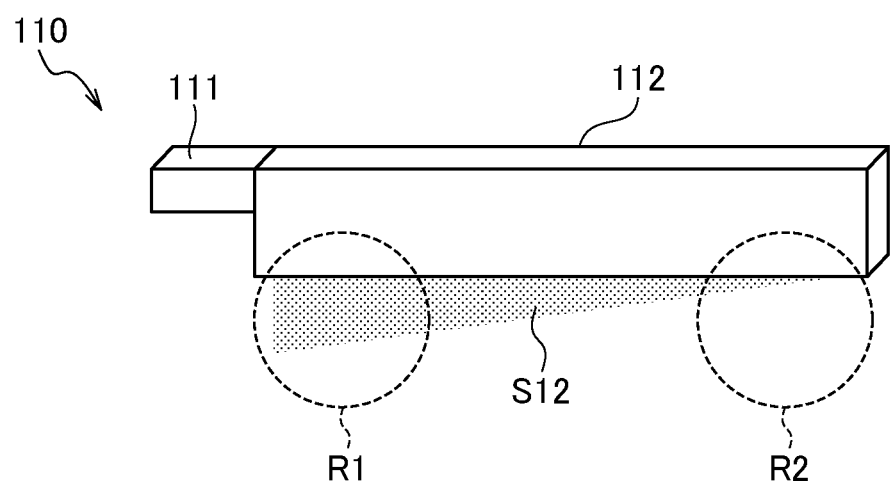
FIG. 15 is a schematic perspective view of a nozzle according to a second comparative example.

FIG. 15 is a schematic perspective view of a nozzle according to a second comparative example. As illustrated in FIG. 15, a nozzle 110 according to the second comparative example includes a microbubble generation nozzle 111 for generating microbubbles, and a header pipe 112 having a liquid supply port communicating with one end of the microbubble generation nozzle 111. A slit (not illustrated) is provided on the lower face of the header pipe 112. Thus, the liquid containing the microbubbles is discharged from the slit provided on the lower face of the header pipe 112 as indicated by a blow-out region S12.

A part of the microbubbles disappears before the liquid containing the microbubbles reaches the slit provided on the lower face of the header pipe 112. Thus, in a region R2 in FIG. 15, the density of the microbubbles becomes lower than that in a region R1, and the nozzle has a problem that the microbubbles contained in the liquid discharged from the slit become uneven.

Third Comparative Example

Figure 16:
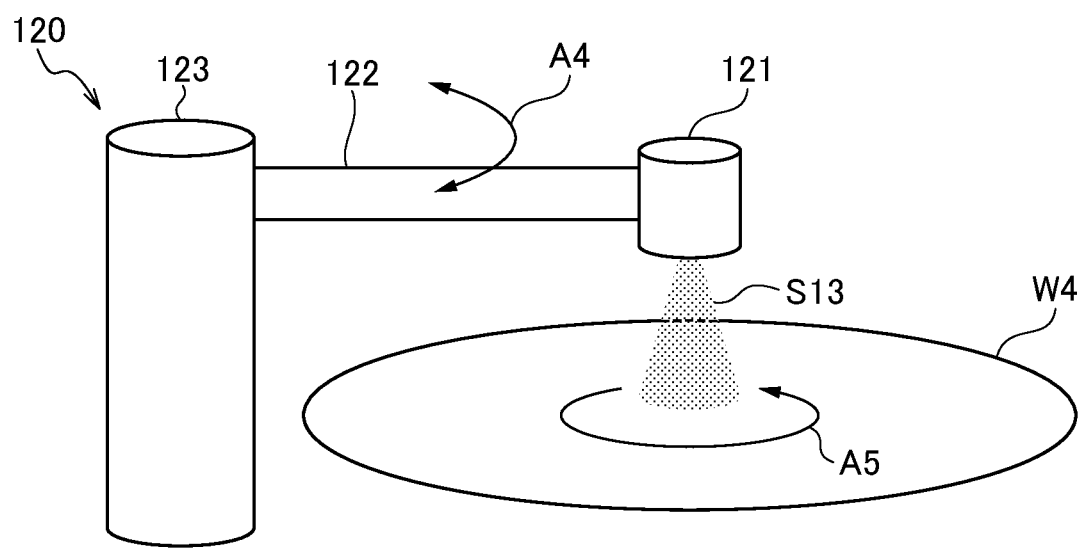
FIG. 16 is a schematic perspective view of a nozzle according to a third comparative example.

FIG. 16 is a schematic perspective view of a nozzle according to a third comparative example. As illustrated in FIG. 16, a nozzle 120 according to the third comparative example includes a microbubble generation nozzle 121, an arm member 122 for supporting the microbubble generation nozzle 121, and a support 123 to which the arm member 122 is connected. The arm member 122 is swingable as indicated by an arrow A4. As indicated by a blow-out region S13 in FIG. 16, a liquid containing microbubbles is blown out from the microbubble generation nozzle 121. A substrate W4 is rotated in the direction of an arrow A5.

Since the diameter of the spray region of the liquid discharged from the nozzle is smaller than the radius of the substrate W4, the nozzle has a problem that the arm member 122 is required to be swung to spread the liquid over the entire region of the substrate W4 in order to spray the liquid over the entire region of the substrate W4, which is time-consuming.

Fourth Comparative Example

Figure 17:
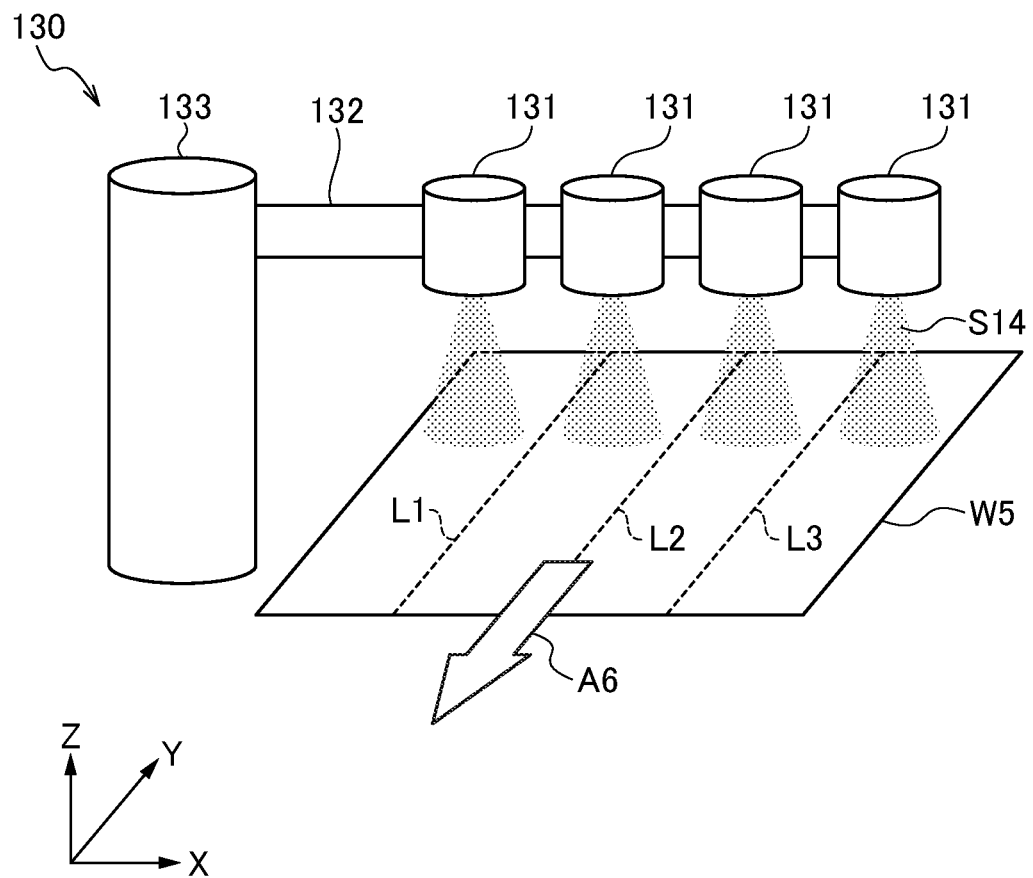
FIG. 17 is a schematic perspective view of a nozzle according to a fourth comparative example.

FIG. 17 is a schematic perspective view of a nozzle according to a fourth comparative example. As illustrated in FIG. 17, a nozzle 130 according to the fourth comparative example includes four microbubble generation nozzles 131, an arm member 132 to which the four microbubble generation nozzles 131 are fixed, and a support 133 to which one end of the arm member 132 is connected. A substrate W5 is linearly conveyed in the direction of an arrow A6. When the substrate W5 is sprayed, the nozzle has a problem that, for example, uneven spraying occurs in the position (for example, positions of dashed lines L1 to L3) of the substrate W5 corresponding to the intermediate position of the adjacent microbubble generation nozzles 131 in the longitudinal direction (X direction) of the arm member 132.

To solve these problems, each embodiment realizes to uniformly spray a liquid containing fine bubbles on an sprayed target object to be sprayed in a curtain shape. In the following embodiments, the sprayed target object to be sprayed is assumed to be a substrate.

In the following embodiments, the term "fine bubble" refers to a bubble having a diameter of up to several mili meters, and includes microbubbles and nanobubbles.

First Embodiment

FIG. 1A is a schematic configuration diagram of a substrate cleaning device according to a first embodiment. As illustrated in FIG. 1A, a substrate cleaning device 10 according to the first embodiment includes a generator 8 for generating a gas-dissolved liquid in which a gas (for example, ozone) is dissolved, a nozzle 1 for generating fine bubbles, piping 4 having one end communicating with the generator 8 and the other end communicating with the nozzle 1, and a supporting member 9 for supporting the substrate (not illustrated) from below. The gas-dissolved liquid generated by the generator 8 is supplied to the nozzle 1 through the piping 4, and a liquid containing the fine bubbles is discharged from the nozzle 1. Thus, the liquid containing the fine bubbles is sprayed on the substrate supported by the supporting member 9. An air drive valve for controlling the flow of liquid is attached to the piping 4 or to the piping inside the generator 8 connected to the piping 4, but is not illustrated for simplicity of explanation.

Figure 1B:
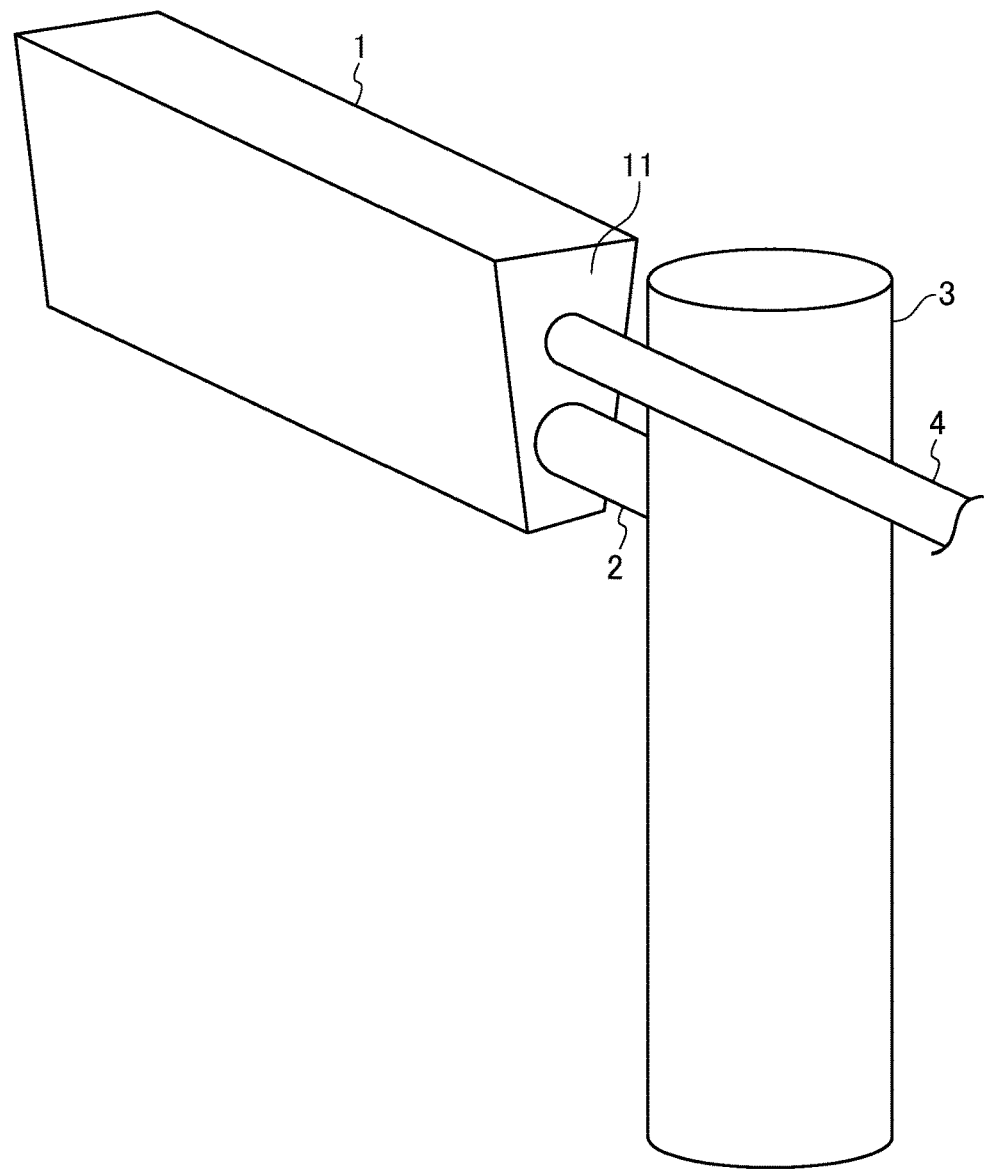
FIG. 1B is a schematic perspective view of a nozzle according to the first embodiment.

FIG. 1B is a schematic perspective view of a nozzle according to the first embodiment. As illustrated in FIG. 1B, for example, the nozzle 1 according to the first embodiment is connected to the piping 4 and is connected to the arm member 2, at an end face 11. The arm member 2 is connected to a support 3, and the nozzle 1 is fixed to the support 3 through the arm member 2.

Figure 2A:
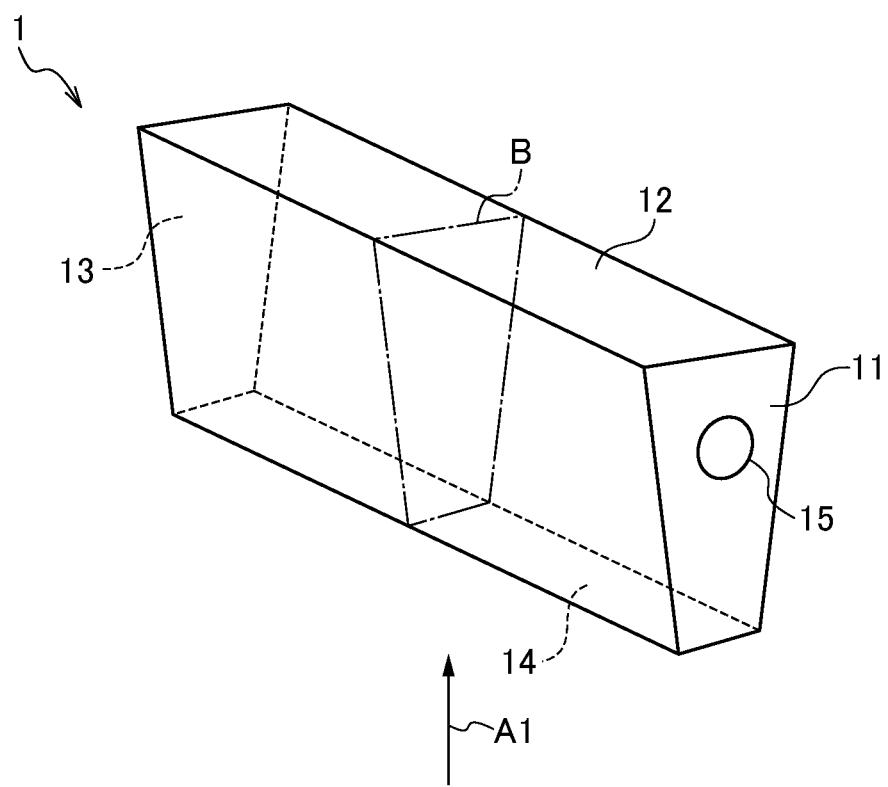
FIG. 2A is a schematic perspective view of the nozzle 1 when the piping 4 is removed.

FIG. 2A is a schematic perspective view of the nozzle 1 when the piping 4 is removed. As illustrated in FIG. 2A, the end face 11 of the nozzle 1 is provided with an inflow port 15 into which the gas-dissolved liquid flows.

Figure 2B:
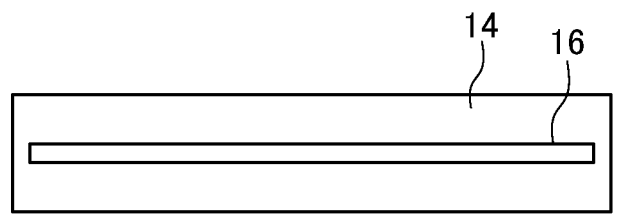
FIG. 2B is an arrow view viewed from an arrow A1 in FIG. 2A.

FIG. 2B is an arrow view viewed from an arrow A1 in FIG. 2A. As illustrated in FIG. 2B, a slit 16 is formed in a lower face 14, and a liquid containing fine bubbles is discharged from the slit 16. In other words, the slit is an opening through which the liquid containing fine bubbles is discharged. The slit 16 is provided, for example, along the longitudinal direction of a housing 17.

Figure 2C:
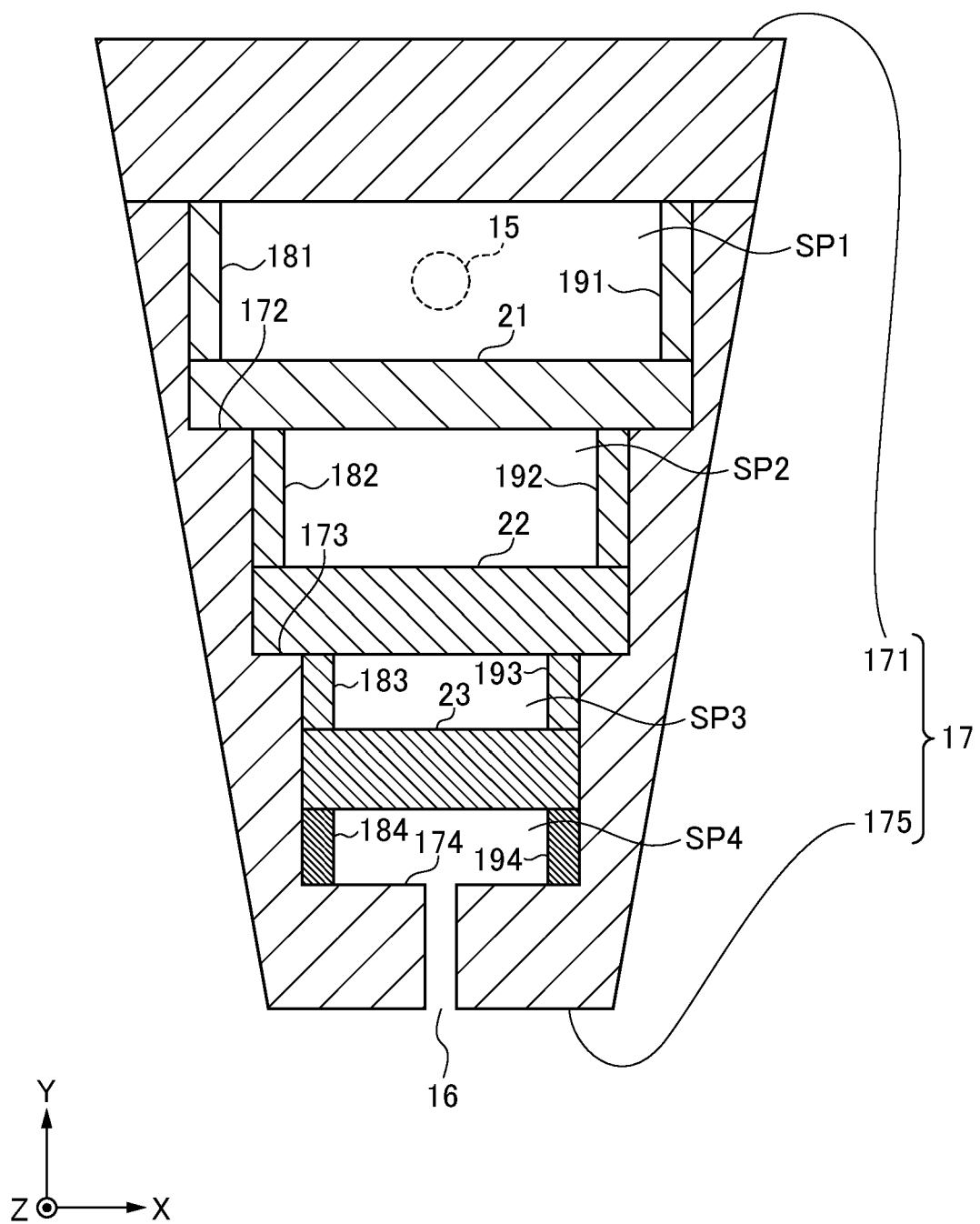
FIG. 2C is a cross-sectional view of the longitudinal section B in FIG. 2A.

FIG. 2C is a cross-sectional view of the longitudinal section B in FIG. 2A. As illustrated in FIG. 2C, the nozzle 1 includes a hollow housing 17, a plate 21 provided in the housing 17 and partitioning the hollow space into two spaces SP1 and SP2, a plate 22 provided in the housing 17 and partitioning the hollow space into two spaces SP2 and SP3, and a plate 23 provided in the housing 17 and partitioning the hollow into two spaces SP3 and SP4. Each of the plates 21 to 23 is provided with a plurality of through-holes. The housing 17 is formed, for example, by fixing a top plate member 171 on a supporting member 175. This fixation is realized, for example, by connecting the top plate member 171 via a bolt or by bonding or welding the top plate member to the supporting member 175 after the supporting member 175 is installed.

In the present embodiment, the principle of generating fine bubbles is that the pressure of the gas-dissolved liquid is released at once at a high pressure in which the gas is sufficiently dissolved and thus the dissolved gas comes out as fine bubbles. In other words, when the liquid in which the dissolved gas is supersaturated under a constant pressure is released to the atmosphere, the gas component of the supersaturated portion is generated from the liquid in the form of fine bubbles. This phenomenon occurs when the gas-dissolved liquid passes through the plate 21 (also referred to as an orifice part) installed in the nozzle 1. The role of the plates 22 and 23 (also referred to as a mesh plate) installed in a step next to the orifice part is to miniaturize the particles by collision of the deposited fine bubbles with the mesh plate.

The roles (features) of the spaces SP1 to SP4 will now be described. The space SP1 is a space into which the gas-dissolved liquid flows and has the highest pressure. In the space SP2, the pressure is released at once by passing the liquid through a plurality of through-holes provided in the plate 21, and fine bubbles are generated. In the space SP3, fine bubbles are further miniaturized. The liquid containing the fine bubbles reaching the space SP4 is rectified, and the liquid is injected from the slit 16 mainly by pressure. Since the pressure decreases when the liquid passes through the through-holes (slits) provided in the plates 21 to 23, the pressure decreases stepwise every time the liquid passes through the spaces SP2, SP3, and SP4.

The height (length in the Y direction in FIG. 2C) of the spaces SP1 to SP4 is preferably 0.5 mm to 20 mm.

As illustrated in FIG. 2C, when the nozzle has steps therein, the cross-sectional areas (for example, the cross-sectional area of the XZ plane or the area of the cross section) of the spaces adjacent below each other preferably have a similar shape having an area ratio of 0.1 to 1.0 with respect to the cross-sectional area (for example, the cross-sectional area of the XZ plane or the area of the cross section) of one of the spaces SP1 to SP4, for example.

The width (length in the X direction in FIG. 2C) of the slit is preferably 0.01 mm to 2 mm.

A step 172 is provided on the inner side face of the housing 17. The plate 21 is arranged on the step 172. The nozzle 1 includes spacers 181 and 191 provided between the top plate member 171 of the housing 17 and the plate 21. Fixing the top plate member 171 to the supporting member 175 causes the spacers 181 and 191 to press the plate 21 against the step 172 of the supporting member 175 by the top plate member 171 to fix the plate 21 to the inside of the housing 17.

Further, a step 173 is provided on the inner side face of the housing 17. The plate 22 is arranged on the step 173. The nozzle 1 includes spacers 182 and 192 provided between the plate 21 and the plate 22. Fixing the plate 21 causes spacers 182 and 192 to press the plate 22 against the step 173 of the supporting member 175 to fix the plate 22.

A step 174 is provided on the inner side face of the housing 17. Spacers 184 and 194 are provided on the step 174. The plate 23 is provided on the spacers 184 and 194. The nozzle 1 includes spacers 183 and 193 provided between the plate 22 and the plate 23. Fixing the plate 22 causes the spacers 183 and 193 to press the plate 23, and the plate 23 further causes the spacers 184 and 194 against the step 174 of the supporting member 175 to fix the plate 23 to the inside of the housing 17. In other words, the spacer 184 and the spacer 194 are pressed by the plate 23, the plate 23 is pressed by the spacer 183 and the spacer 193, the spacer 183 and the spacer 193 are pressed by the plate 22, the plate 22 is pressed by the spacer 182 and the spacer 192, the spacer 182 and the spacer 192 are pressed by the plate 21, the plate 21 is pressed by the spacer 181 and the spacer 191, and the spacer 181 and the spacer 191 are pressed by the top plate member 171. Thus, the plates 21 to 23 are respectively pressed by the spacers 181 to 184 and 191 to 194, and the positions of the plates and the spacers are prevented from being displaced.

The spacers 181 and 191 may be a separate or an integrated body. Similarly, the spacers 182 and 192 may be a separate or an integrated body. Similarly, the spacers 183 and 193 may be a separate or an integrated body. Similarly, the spacers 184 and 194 may be a separate or an integrated body. A separate body may be a rod shape, and an integrated body may be a square frame shape. Since an integrated body is easier to assemble the nozzle than a separate body, an integrated body is more preferable.

As illustrated in FIG. 2C, the inflow port 15 communicates with the upper space SP1 of the spaces SP1 and SP2 partitioned by the plate 21. Note that the inflow port 15 may be provided on the upper face 12 or on the end face 13 corresponding to the end face 11. In other words, the upper face or the side face of the housing 17 is provided with the inflow port into which the gas-dissolved liquid flows and which communicates with the uppermost space SP1 of the spaces SP1 to SP4 partitioned by the plates 21 to 23. When the gas-dissolved liquid is supplied from the upper face 12, the number of supply ports is not limited to one, and a plurality of supply ports may be provided so that the supply ports are equally arranged. Further, the gas-dissolved liquid may be simultaneously supplied from the end face 11 and the end face 13.

The pressure of the gas-dissolved liquid, when supplied, is preferably 0 to 1.0 MPa. The gas-dissolved liquid is first introduced into the space SP1.

Note that the longitudinal section of the nozzle 1 need not be trapezoidal as illustrated in FIG. 2C, and the inner structure of the nozzle 1 may stay the same, and only the longitudinal section of the housing 17 of the nozzle 1 may be rectangular. The shape of the longitudinal section may be any shape as long as the shape can house the plate therein.

Figure 2D:
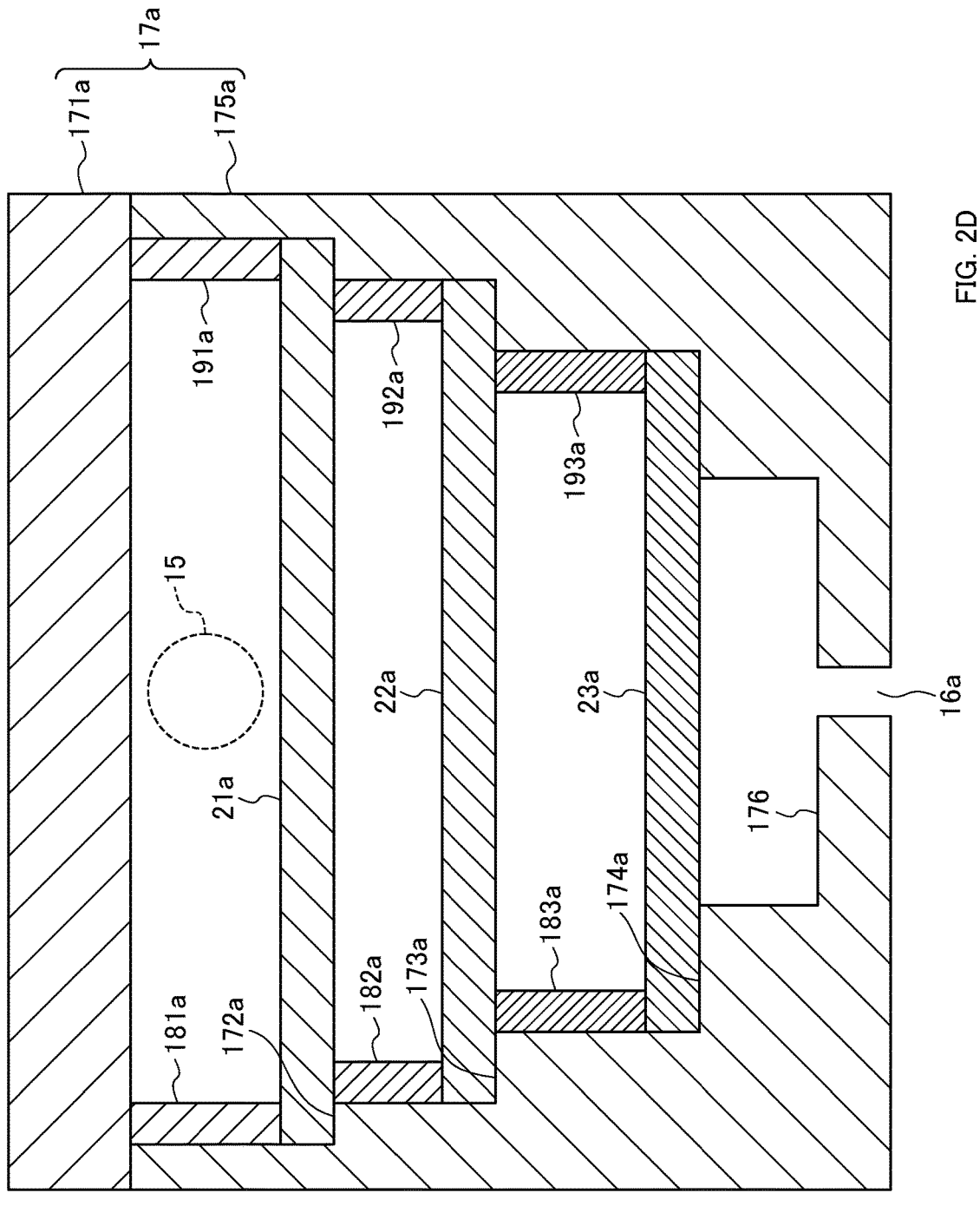
FIG. 2D is a longitudinal sectional view of a first modification of the first embodiment.

FIG. 2D is a longitudinal sectional view of a first modification of the first embodiment. As illustrated in FIG. 2D, a nozzle 1a1 according to the first modification of the first embodiment is similar to the nozzle 1 in FIG. 2C in that the longitudinal section of the supporting member 175a tapers toward the lower face in a stepwise manner (i.e. in the Y direction), but the longitudinal section of the housing 17a is changed to a rectangle.

As illustrated in FIG. 2D, the nozzle 1a1 in FIG. 2D is different from the nozzle 1 in FIG. 2C in that no spacer is provided on the inner bottom face 176 of the supporting member 175a of the nozzle 1a1. The specific structure of the supporting member 175a is as follows. A plate 23a is installed on a step 174a inside the supporting member 175a of the housing 17a. Spacers 183a and 193a are provided on the plate 23a. The height of the upper ends of the spacers 183a and 193a is the same as the height of the step 173a, and a plate 22a is provided on the spacers 183a and 193a, and the step 173a. Spacers 182a and 192a are provided on the plate 22a. Similarly, the height of the upper ends of the spacers 182a and 192a is the same as the height of the step 172a, and a plate 21a is provided on the spacers 182a and 192a, and the step 172a. Spacers 181a and 191a are provided on the plate 21a. The height of the upper ends of the spacers 181a and 191a is the same as the height of the upper end of the supporting member 175a, and a top plate member 171a is provided on the spacers 181a and 191a, and the supporting member 175a. A slit 16a is provided on the bottom face of the supporting member 175a.

The spacers 181a and 191a may be a separate or an integrated body. Similarly, the spacers 182a and 192a may be a separate or an integrated body. Similarly, the spacers 183a and 193a may be a separate or an integrated body. Similarly, the spacers 184a and 194a may be a separate or an integrated body. A separate body may be a rod shape, and an integrated body may be a square frame shape. Since an integrated body is easier to assemble the nozzle than a separate body, an integrated body is more preferable.

Note that in FIG. 2C, the longitudinal section of the supporting member 175 of the nozzle 1 tapers (the longitudinal section of the supporting member 175 is a staircase structure) toward the lower face (i.e. in the Y direction), but the width of the supporting member 175 in the X direction may be substantially constant in the Y direction. However, as illustrated in FIG. 2C, tapering the longitudinal sectional shape of the nozzle toward the lower face is more preferable, since placing the plates 21, 22, and 23 on the lower face facilitate fixing. If the height of the spacer is accurate, the staircase structure may be eliminated, as illustrated in FIG. 2E.

Figure 2E:
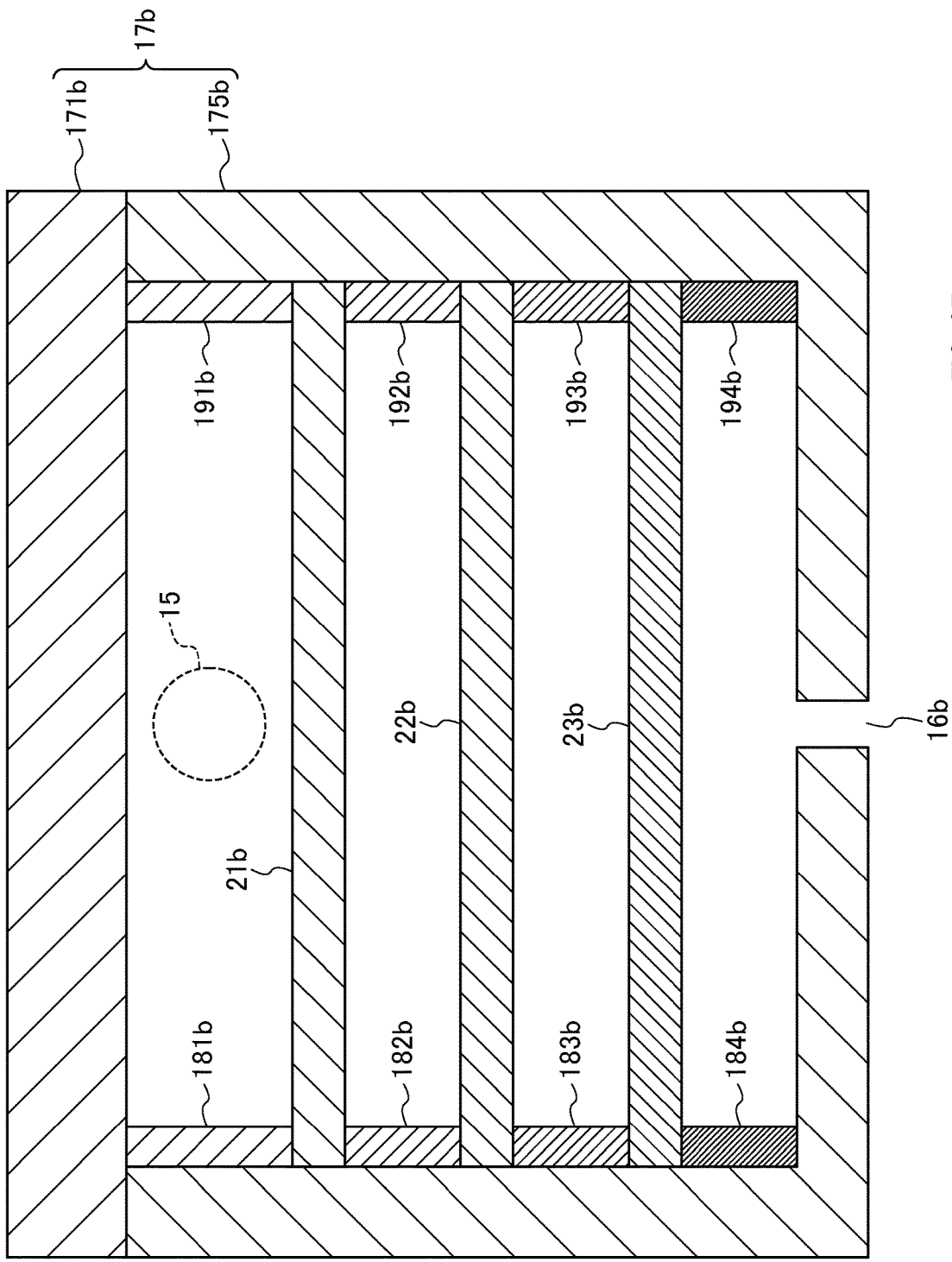
FIG. 2E is a longitudinal sectional view of a second modification of the first embodiment.

FIG. 2E is a longitudinal sectional view of a second modification of the first embodiment. As illustrated in FIG. 2E, in a nozzle 1a2, spacers 184b and 194b are provided on the inner bottom face of a supporting member 175b of a housing 17b, and a plate 23b is provided on the spacers 184b and 194b. Spacers 183b and 193b are also provided on the plate 23b, and a plate 22b is provided on the spacers 183b and 193b. In addition, spacers 182b and 192b are provided on the plate 22b, and a plate 21b is provided on the spacers 182b and 192b. Further, spacers 181b and 191b are provided on the plate 21b, and a top plate member 171b is provided on the spacers 181b and 191b. A slit 16b is also provided on the bottom face of a supporting member 172b.

The spacers 181b and 191b may be a separate or an integrated body. Similarly, the spacers 182b and 192b may be a separate or an integrated body. Similarly, the spacers 183b and 193b may be a separate or an integrated body. Similarly, the spacers 184b and 194b may be a separate or an integrated body. A separate body may be a rod shape, and an integrated body may be a square frame shape. Since an integrated body is easier to assemble the nozzle than a separate body, an integrated body is more preferable.

Figure 2F:
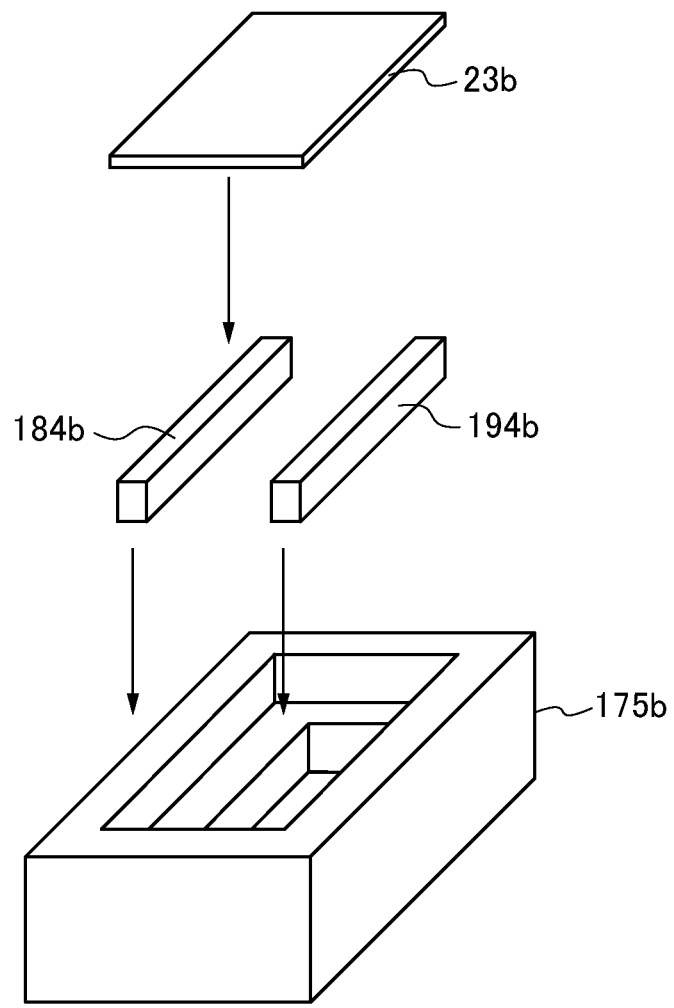
FIG. 2F is a schematic view illustrating a process of assembling a part of the nozzle 1$a$2 according to the second modification of the first embodiment when the spacers 184$b$ and 194$b$ are separate bodies.

FIG. 2F is a schematic view illustrating a process of assembling a part of the nozzle 1a2 according to the second modification of the first embodiment when the spacers 184b and 194b are separate bodies. As illustrated in FIG. 2F, rod-shaped spacers 184b and 194b are arranged on the inner bottom face of the supporting member 175b, and then a plate 23b is arranged on the spacers 184b and 194b.

Figure 2G:
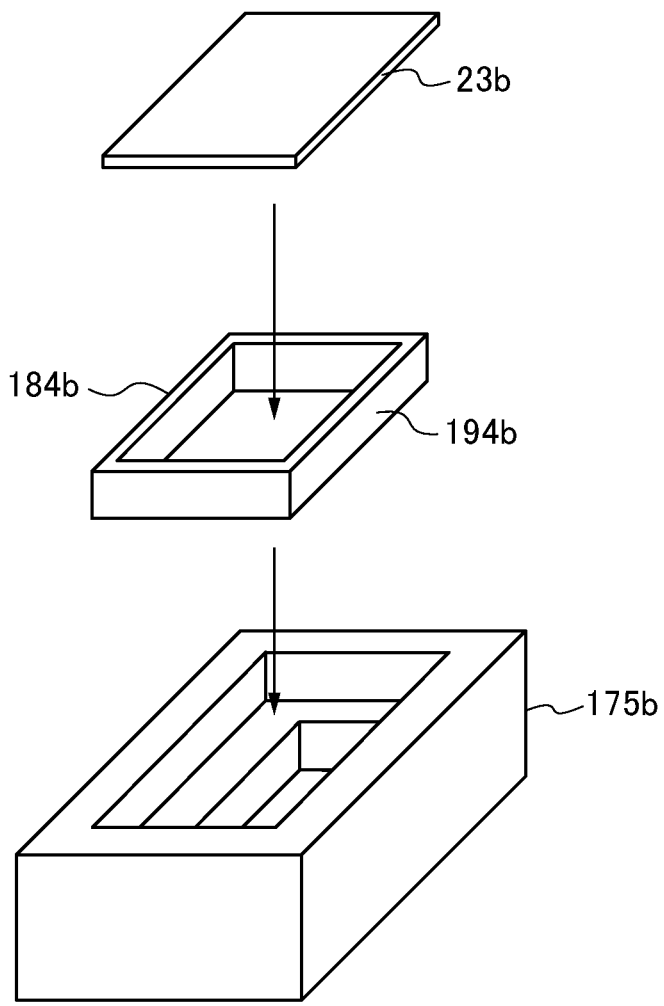
FIG. 2G is a schematic view illustrating a process of assembling a part of the nozzle 1$a$2 according to the second modification of the first embodiment when the spacers 184$b$ and 194$b$ are integrated.

FIG. 2G is a schematic view illustrating a process of assembling a part of the nozzle 1a2 according to the second modification of the first embodiment when the spacers 184b and 194b are integrated. As illustrated in FIG. 2G, the spacers 184b and 194b form side parts of the spacers having the shape of a square frame. As illustrated in FIG. 2G, a spacer of a square frame having spacers 184b and 194b is arranged on the inner bottom face of the supporting member 175b, and then a plate 23b is arranged on the spacer.

Figure 3A:
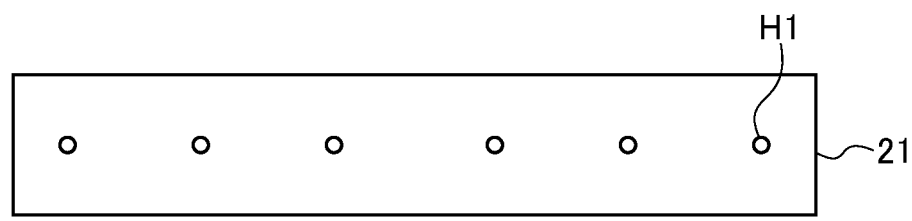
FIG. 3A is an example of a plan view of the plate 21.
Figure 3B:
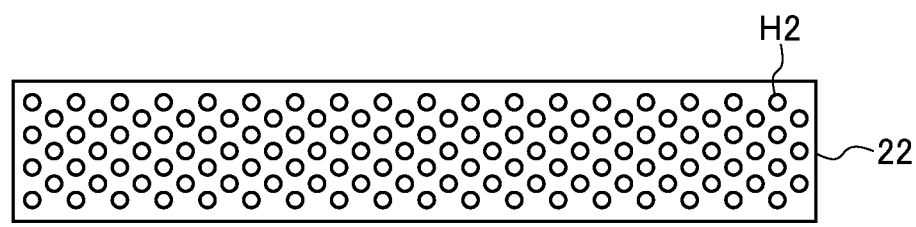
FIG. 3B is an example of a plan view of the plate 22.
Figure 3C:
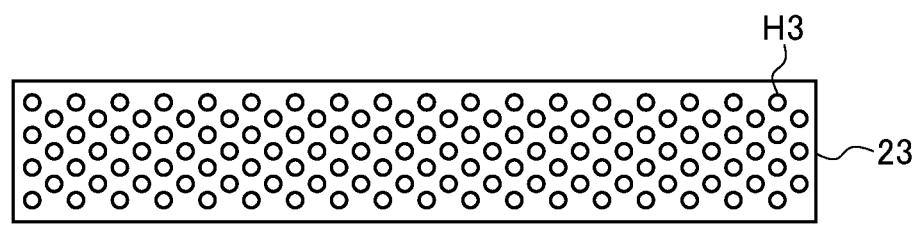
FIG. 3C is an example of a plan view of the plate 23.

FIG. 3A is an example of a plan view of the plate 21. FIG. 3B is an example of a plan view of the plate 22. FIG. 3C is an example of a plan view of the plate 23. As illustrated in FIG. 3A, the plate 21 is provided with a plurality of through-holes H1 having a micro-diameter (for example, about 2.0 mm in diameter at the maximum) as an example. In FIG. 3A, these through-holes H1 are provided at equal intervals as an example. In this drawing, as an example, the numbers of the through-holes H2 and H3 are substantially the same, and the sizes of the through-holes H2 and H3 are substantially the same. The angle between the axis of the through-hole and the plane of the plates 21, 22 and 23 may be a right angle or may have a constant angle other than a right angle.

The gas-dissolved liquid moves into the space SP2 through the through-hole H1 worked on the plate 21. The move of the gas-dissolved liquid into the space SP2 causes the pressure of the gas-dissolved liquid at the time of supply to be released and to generate the dissolved gas. Thus, in the space SP2, the gas-dissolved liquid is separated into gas and liquid. The liquid and the gas (bubble) in the space SP2 move to the space SP3 through the plate 22. The plate 22 is provided with a plurality of through-holes H2 having a micro-diameter (for example, about 2.0 mm in diameter at the maximum). Therefore, the bubble is miniaturized in the process of the bubble passing through the plate 22.

Similarly, the liquid and the gas (bubble) reaching the space SP3 pass through the plate 23 and move to the space SP4. The plate 23 is provided with a plurality of through-holes H3 having a micro-diameter (for example, about 2.0 mm in diameter at the maximum). Therefore, the bubble is miniaturized in the process of the bubble passing through the plate 23.

As a result, in the process in which the liquid and the gas bubbles separated in the space SP2 pass through the plates 22 and 23, respectively, the bubble is miniaturized, and when the liquid reaches the space SP4, a liquid containing fine bubbles (for example, nano-sized to micro-sized bubbles) is generated. The slit 16 communicating with the lowermost space SP4 of the spaces SP1 to SP4 partitioned by the plates 21 to 23 is provided on the lower face of the housing 17. The slit 16 may be formed by machining a desired slit with a blade and wire, for example. Note that in the present embodiment, the slit 16 is provided at a right angle to the outer lower face of the housing 17, but the present invention is not limited thereto, and the slit may have a fixed angle other than a right angle to the outer lower face of the housing 17, in other words, the slit 16 may be provided obliquely to the outer lower face of the housing 17.

Figure 3D:
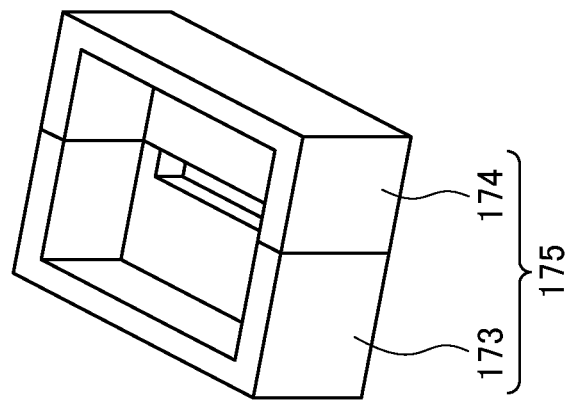
FIG. 3D is a view for describing another example of a method of realizing the slit 16.
Figure 3D:
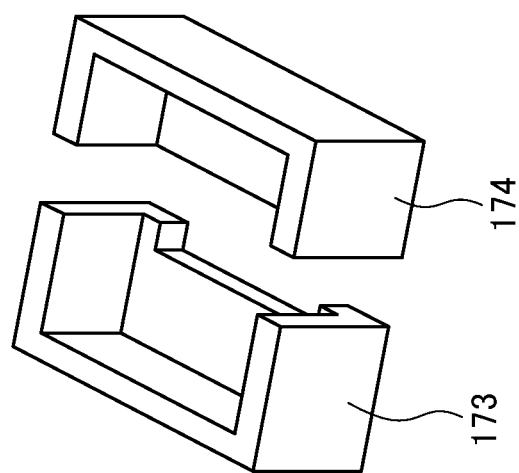

FIG. 3D is a view for describing another example of a method of realizing the slit 16. FIG. 3D is a perspective view illustrating an example of the lower face side of the supporting member 175. As illustrated in FIG. 3D, the first portion 173 having a notch formed in the shape of the slit 16, and the second portion 174 may be prepared in advance, and the first portion 173 and the second portion 174 may be bonded, welded, or bolted to form the supporting member 175. Thus, a desired slit width can be realized.

Figure 4A:
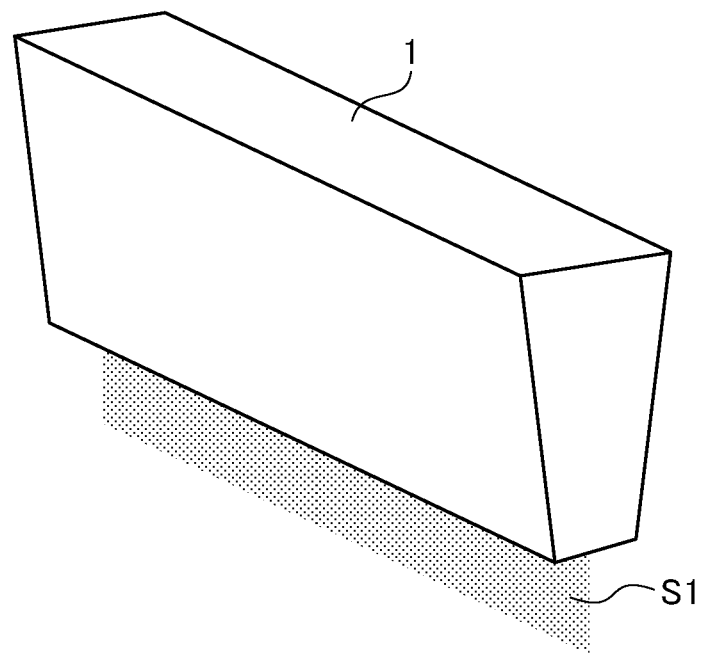
FIG. 4A is a schematic view illustrating how liquid is discharged from a nozzle according to the first embodiment.
Figure 4B:
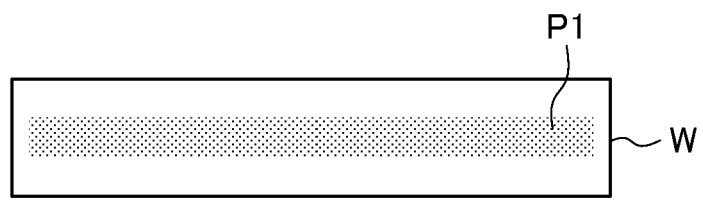
FIG. 4B illustrates a pattern of liquid discharged onto a substrate.

FIG. 4A is a schematic view illustrating how liquid is discharged from a nozzle according to the first embodiment. FIG. 4B illustrates a pattern of liquid discharged onto a substrate. The liquid containing fine bubbles that have reached the space SP4 passes through the slit 16, and is discharged in a row of strips as indicated by a liquid S1 in FIG. 4A. Thus, as indicated by the pattern P1 in FIG. 4B, a liquid containing fine bubbles is uniformly sprayed on the substrate W in a row.

This configuration enables to uniformly spray a liquid containing fine bubbles onto a substrate, which is an example of a sprayed target object to be sprayed, in a row without causing unevenness. Further, since a liquid containing fine bubbles can be uniformly generated in a row in the nozzle, the quantity distribution of the fine bubbles depending on the position in the row is eliminated.

Figure 5:
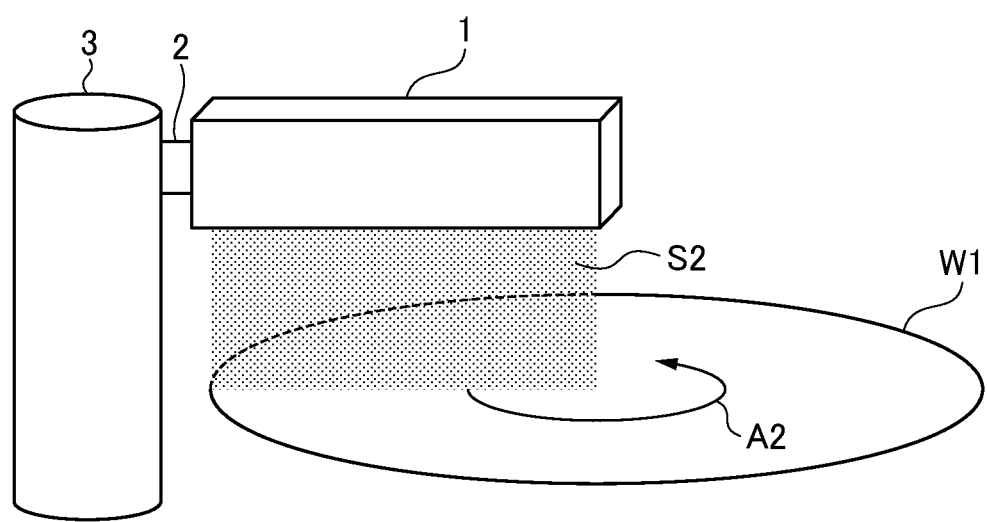
FIG. 5 is a schematic view illustrating how a liquid containing fine bubbles is discharged from the nozzle according to the first embodiment to a substrate.

FIG. 5 is a schematic view illustrating how a liquid containing fine bubbles is discharged from the nozzle according to the first embodiment to a substrate. As illustrated in FIG. 5, a liquid containing fine bubbles is discharged in a row from the nozzle 1 to a substrate W1 rotated in the direction of an arrow A2 as indicated by a discharged liquid S2. The range of the liquid discharged in a row from the nozzle 1 is a range from the center of the substrate W1 to the outer edge of the substrate W1. Thus, rotating the substrate W1 enables a liquid containing fine bubbles to be uniformly sprayed on the entire surface of the substrate W1. Thus, the liquid containing the fine bubbles can be uniformly sprayed on the entire substrate W1 without oscillating the arm member 2 to which the nozzle 1 is attached. Note that the range of the liquid discharged in a row from the nozzle 1 is not limited to the above, and may include a range from the center of the substrate W1 to a position exceeding the outer edge of the substrate W1.

Figure 6:
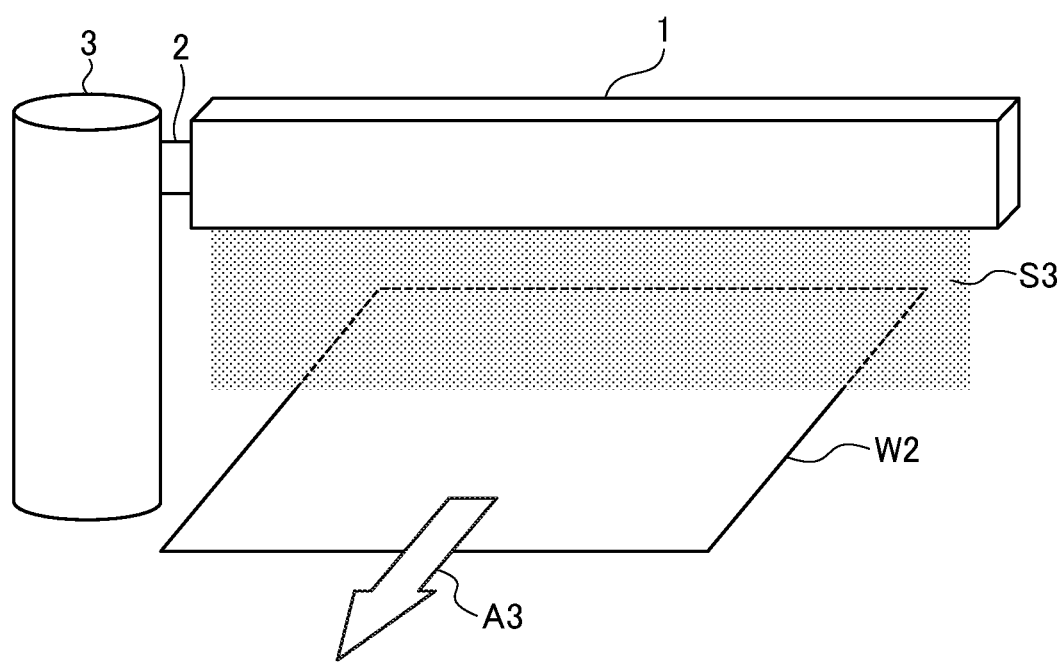
FIG. 6 is a schematic view illustrating how a liquid containing fine bubbles is discharged from the nozzle according to the first embodiment to a substrate.

FIG. 6 is a schematic view illustrating how a liquid containing fine bubbles is discharged from the nozzle according to the first embodiment to a substrate. As illustrated in FIG. 6, while the substrate W2 moves linearly in the direction of an arrow A3, a liquid containing fine bubbles is discharged in a row from the nozzle 1 as indicated by a discharged liquid S3. The range of the liquid discharged in a row from the nozzle 1 includes the width of a substrate W2 in the direction substantially perpendicular to the moving direction of the substrate W2. Thus, the liquid containing the fine bubbles can be uniformly sprayed on the entire substrate.

Note that, in order to obtain a desired distribution of the fine bubbles to be generated and a desired diameter of the bubbles, the hole shape (round, oblong, square, triangle) provided in the plates 21 to 23, the size thereof, and the arrangement of the processing may be suitably changed. Further, the arrangement quantity of the plates 21 to 23 and/or the number of spaces SP1 to SP4 may be increased or decreased.

First Modification

Figure 7A:
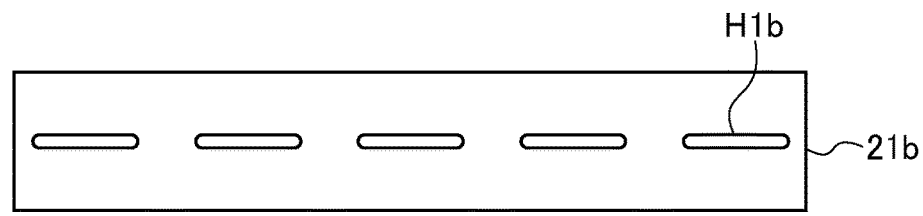
FIG. 7A is a plan view of a plate 21$b$ according to a first modification.
Figure 7B:
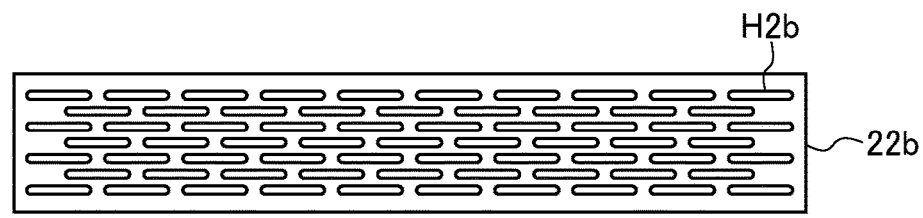
FIG. 7B is a plan view of a plate 22$b$ according to the first modification.
Figure 7C:
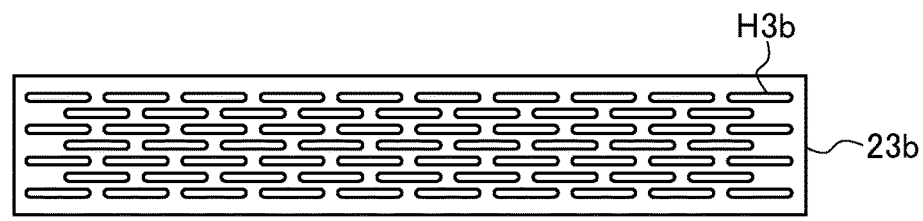
FIG. 7C is a plan view of a plate 23$b$ according to the first modification.

FIG. 7A is a plan view of a plate 21b according to a first modification. FIG. 7B is a plan view of a plate 22b according to the first modification. FIG. 7C is a plan view of a plate 23b according to the first modification.

As illustrated in FIG. 7A, the plate 21b according to the first modification may be provided with through-holes H1b (for example, slits up to a width of about 2.0 mm) at regular intervals. As illustrated in FIG. 7B, the plate 22b according to the first modification may be provided with a plurality of through-holes smaller than the through-holes H1b of the plate 21b. As illustrated in FIG. 7B, the number of through-holes H2b of the plate 22b according to the first modification is larger than the number of through-holes H1b of the plate 21b. As illustrated in FIG. 7C, the plate 23b according to the first modification may be provided with a plurality of slits smaller than the slits of the plate 21b. As illustrated in FIG. 7C, the number of through-holes H3b of the plate 23b according to the first modification is larger than the number of through-holes H1b of the plate 21b. In this modification, as an example, the number of the through-holes H2b and the number of the through-holes H3b are substantially the same, and the sizes of the through-holes H2b and the through-holes H3b are substantially the same.

Second Modification

Figure 8A:
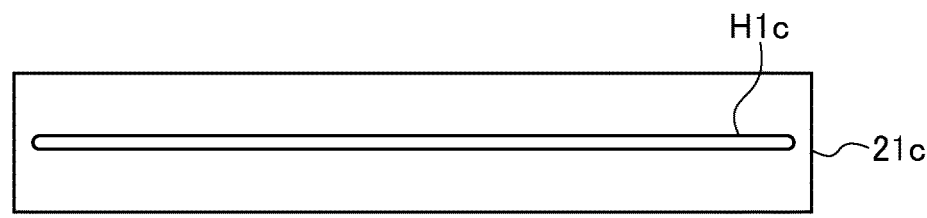
FIG. 8A is a plan view of a plate according to a second modification.
Figure 8B:
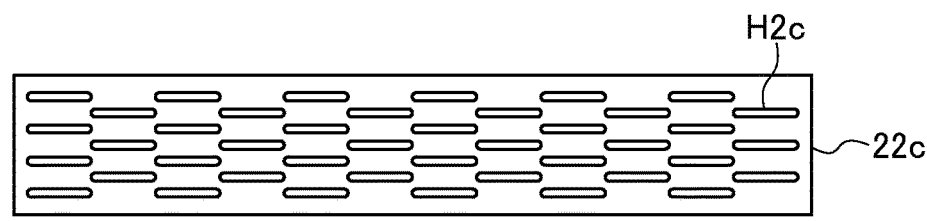
FIG. 8B is a plan view of a plate according to the second modification.
Figure 8C:
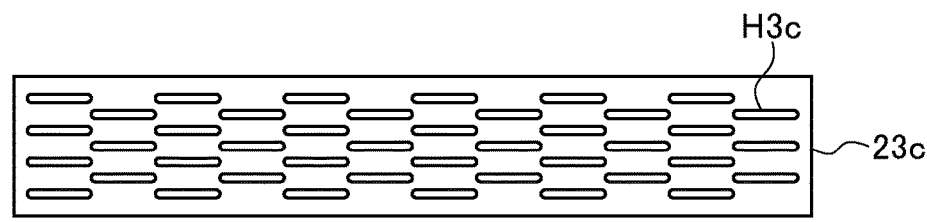
FIG. 8C is a plan view of a plate according to the second modification.

As illustrated in FIG. 8A, a plate 21c according to a second modification may be provided with slits (for example, slits up to a width of about 2.0 mm) continuously. As illustrated in FIG. 8B, a plate 22c according to the second modification may be provided with a plurality of through-holes H2c smaller than the through-holes H1c of the plate 21c. As illustrated in FIG. 8B, the number of through-holes H2c of the plate 22c according to the second modification is larger than the number of through-holes H1c of the plate 21c. As illustrated in FIG. 8C, a plate 23c according to the second modification may be provided with a plurality of through-holes smaller than the through-holes of the plate 21c. As illustrated in FIG. 8C, the number of through-holes H3c of the plate 23c according to the second modification is larger than the number of through-holes H1c of the plate 21c. In this modification, as an example, the number of the through-holes H2c and the number of the through-holes H3c are substantially the same, and the sizes of the through-holes H2c and the through-holes H3c are substantially the same.

As described above, in the second plate (for example, plate 22) provided below the first plate (for example, plate 21) of the plurality of plates, the number of through-holes is larger than that of the first plate (for example, plate 21), and/or the size of the through-holes is smaller than and equal to that of the through-holes (for example, plate 22) of the first plate (for example, plate 21). This configuration enables the bubble to be miniaturized.

As described above, the nozzle according to the first embodiment is the nozzle 1 for generating fine bubbles, and includes a hollow housing 17 and a plurality of plates 21 to 23 provided in the housing 17 and partitioning the housing into a plurality of spaces. The upper face or the side face of the housing 17 is provided with an inflow port into which the gas-dissolved liquid flows and which communicates with the uppermost space SP1 of the spaces partitioned by the plates 21 to 23, each of the plates 21 to 23 is provided with a plurality of through-holes, and the lower face of the housing 17 is provided with the slit 16 communicating with the lowermost space SP4 of the spaces partitioned by the plates 21 to 23.

This configuration allows the bubble to be miniaturized in the process in which the liquid and gas bubbles separated by passing through the plate 21 pass through the plate 22 or 23, respectively, and allows the liquid containing the fine bubbles to be generated when the liquid reaches the lowermost space SP4 of the spaces partitioned by the plate. The liquid containing the fine bubbles is discharged through the slit 16. Therefore, the uniformity in spraying the liquid containing the fine bubbles onto the substrate can be improved.

In the present embodiment, the plurality of plates 21 to 23 is provided substantially parallel to the lower face of the housing, but the present invention is not limited thereto, and an angle that is not parallel to the lower face of the housing may be provided. Further, in the present embodiment, the plurality of plates 21 to 23 is provided substantially in parallel with each other, but the present invention is not limited thereto, and angles which are not parallel may be provided.

A second to fifth embodiments will be then described. The second to fifth embodiments differ from the first embodiment in that the nozzle includes a heating means that heats the housing 17 or the gas-dissolved liquid. Thus, heating the liquid just before being sprayed on the substrate intentionally lowers the gas solubility, and promotes the generation of bubbles. According to this configuration, the gas-dissolved liquid (for example, ozone water) immediately before being supplied to the nozzle is at room temperature, for example, and easy to control the concentration. Further, in order to spray the heated liquid onto the substrate through the nozzle, the need to hold the heated gas-dissolved liquid at a high pressure is eliminated.

In the second to fifth embodiments, the aspects of the heating means are different from each other. The details are described below.

Second Embodiment

Figure 9A:
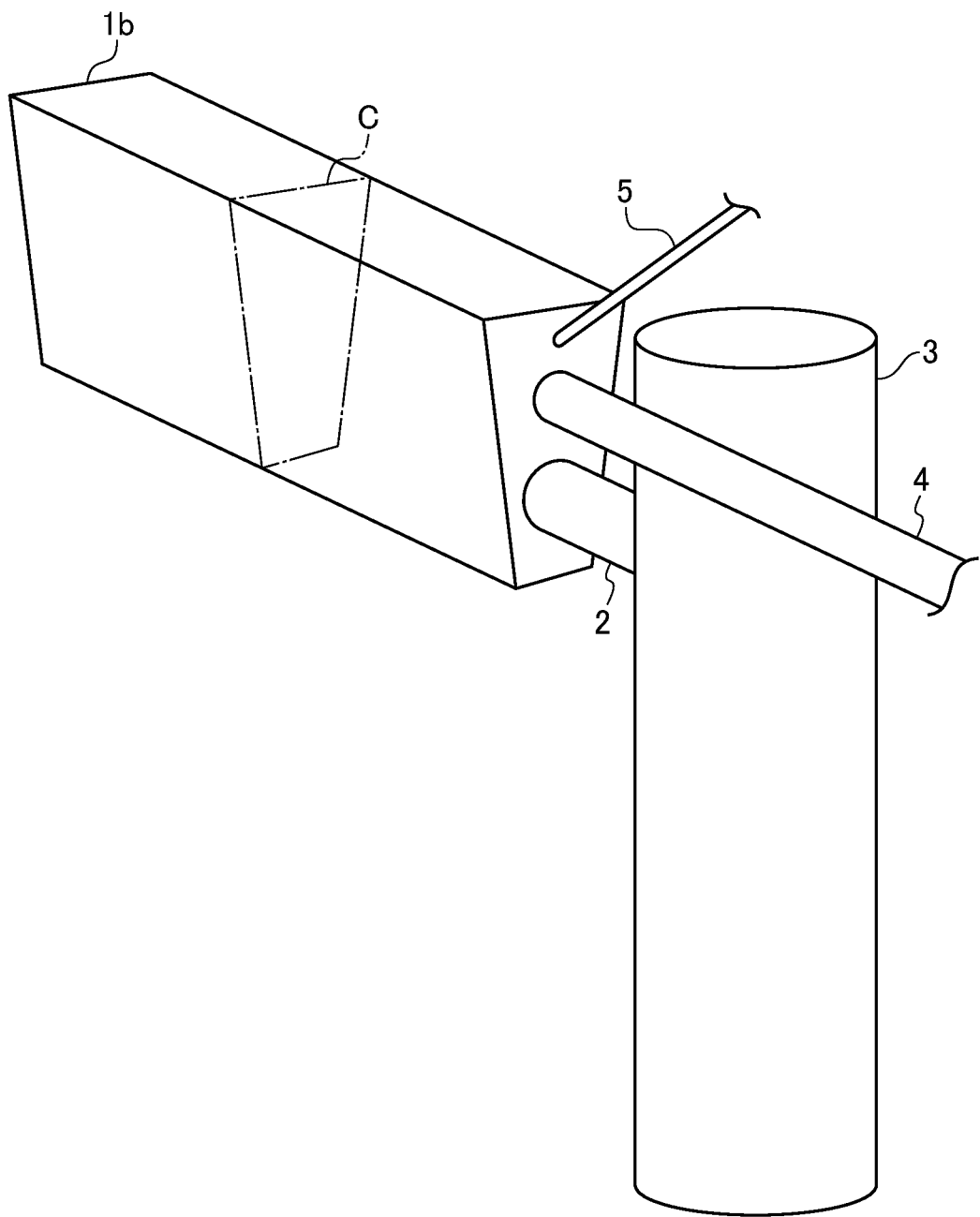
FIG. 9A is a schematic perspective view of a nozzle according to the second embodiment.
Figure 9B:
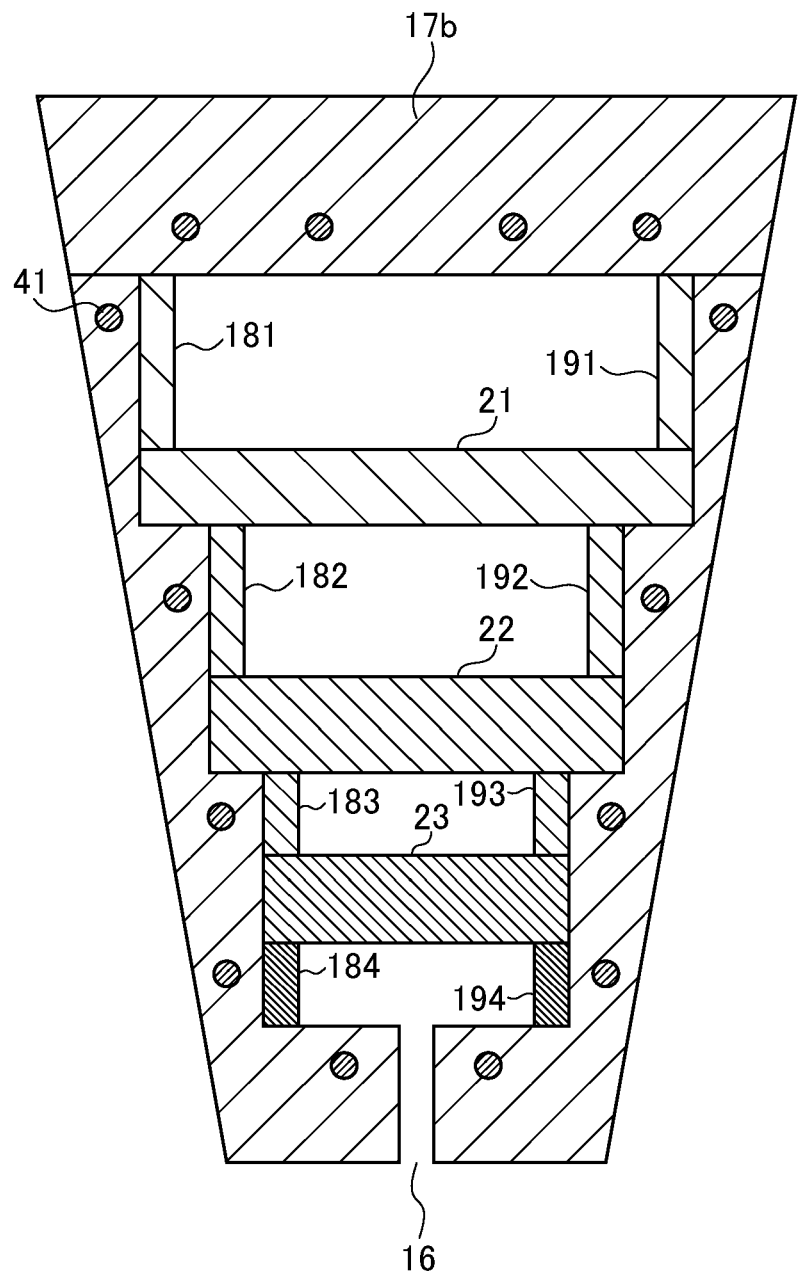
FIG. 9B is a cross-sectional view of the longitudinal section C in FIG. 9A.

First, a second embodiment will be described. FIG. 9A is a schematic perspective view of a nozzle according to the second embodiment. FIG. 9B is a cross-sectional view of the longitudinal section C in FIG. 9A. In the nozzle 1b according to the second embodiment in FIG. 9A, a wiring 5 for supplying electricity to an electric heating member 41 is added to the nozzle 1 according to the first embodiment in FIG. 2A. The same reference numerals are used to designate the same components in FIGS. 2A and 2B, and a description thereof will be omitted.

In the second embodiment, as illustrated in FIG. 9B, the heating means is the electric heating member (for example, heating wire) 41 provided in the housing 17b, and in this embodiment, the heating means is provided in the housing 17b as an example. The electric heating member 41 is connected to the wiring 5 and is heated by the current supplied by the wiring 5. Heating the housing 17 by the electric heating member 41 enables the liquid passing through the nozzle 1b to be heated.

Note that the electric heating member 41 may be provided on the surface of the housing 17, or may be provided on the inner surface of the housing 17 to directly heat the gas-dissolved liquid.

Third Embodiment

Figure 10:
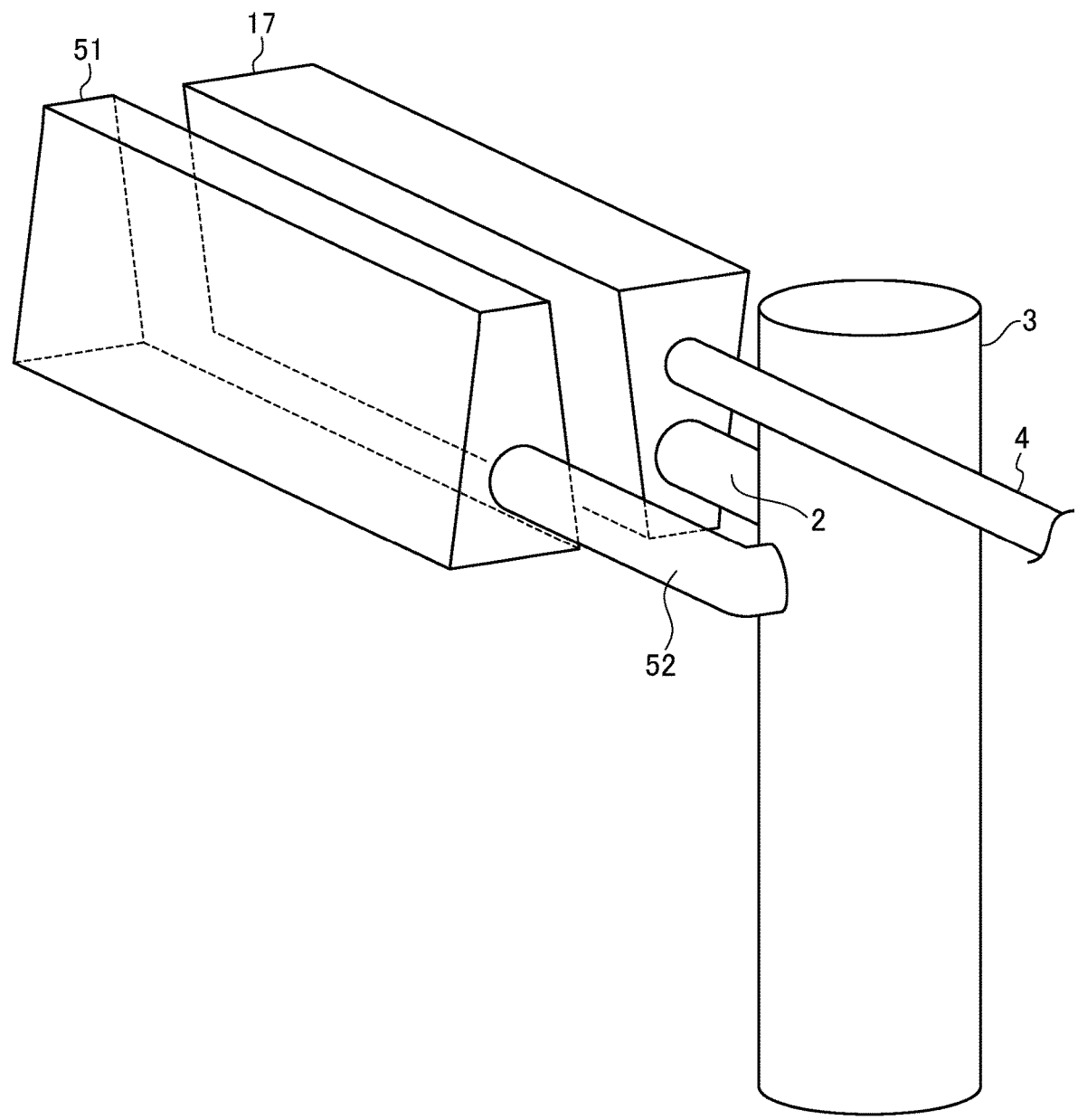
FIG. 10 is a schematic perspective view of a nozzle according to the third embodiment.

A third embodiment will be then described. FIG. 10 is a schematic perspective view of a nozzle according to the third embodiment. In a nozzle 1c according to the third embodiment in FIG. 10, an infrared ray irradiator 51 and an arm member 52 for fixing the infrared ray irradiator 51 to the support 3 is added to the nozzle 1 according to the first embodiment in FIG. 2A. The same reference numerals are used to designate the same components in FIG. 2A, and a description thereof will be omitted. In the third embodiment, as illustrated in FIG. 10, the heating means is an infrared ray irradiator 51 which irradiates the housing 17 with infrared rays by irradiating the housing 17 with infrared rays from a surface facing the housing. Thus, heating the housing 17 by infrared rays enables the liquid passing through the nozzle 1c to be heated. Although one infrared ray irradiator is illustrated in FIG. 10, another infrared ray irradiator may be installed on the opposite side of the housing 17, by holding the nozzle between the irradiators, to heat from both sides of the nozzle. Further, when the liquid is supplied from the side faces 11 and 12, an infrared ray irradiator may be installed above the housing 17 to heat the liquid from three directions.

Fourth Embodiment

Figure 11A:
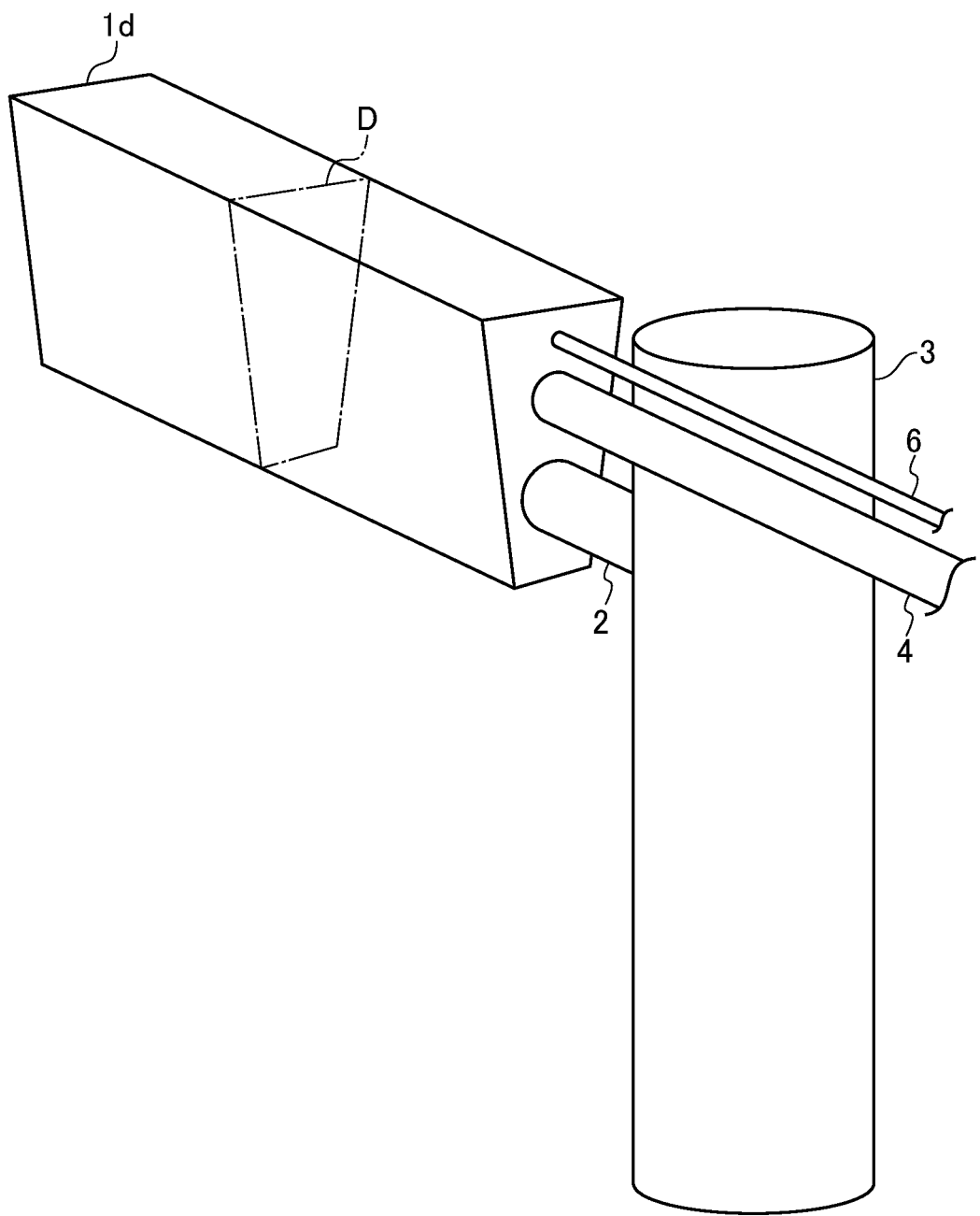
FIG. 11A is a schematic perspective view of a nozzle according to the fourth embodiment.
Figure 11B:
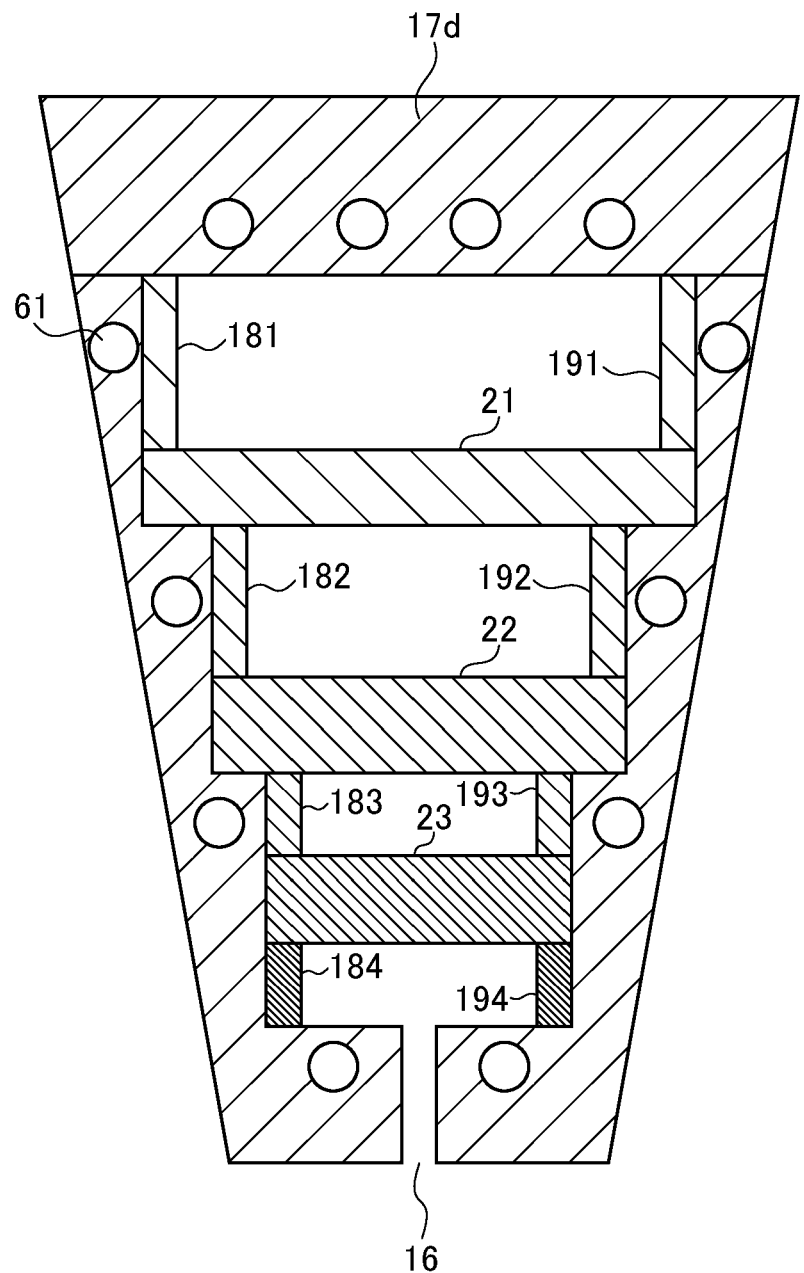
FIG. 11B is a cross-sectional view of the longitudinal section D in FIG. 11A.

A fourth embodiment will be then described. FIG. 11A is a schematic perspective view of a nozzle according to the fourth embodiment. FIG. 11B is a cross-sectional view of the longitudinal section D in FIG. 11A. In a nozzle 1d according to the fourth embodiment in FIG. 11A, a piping 6 for circulating a medium having a predetermined temperature or higher inside the nozzle 1d is added to the nozzle 1 according to the first embodiment in FIG. 2A. The same reference numerals are used to designate the same components in FIGS. 2A and 2B, and a description thereof will be omitted.

In the fourth embodiment, the heating means is a medium (for example, liquid or gas) flowing inside the housing 17d and having a temperature equal to or higher than a predetermined temperature. As illustrated in FIG. 11B, a cavity 61 is provided inside the housing 17d, and when a medium of a predetermined temperature or higher passes through the cavity 61, the housing 17d is heated, whereby the liquid passing through the nozzle 1d can be heated.

Fifth Embodiment

Figure 12A:
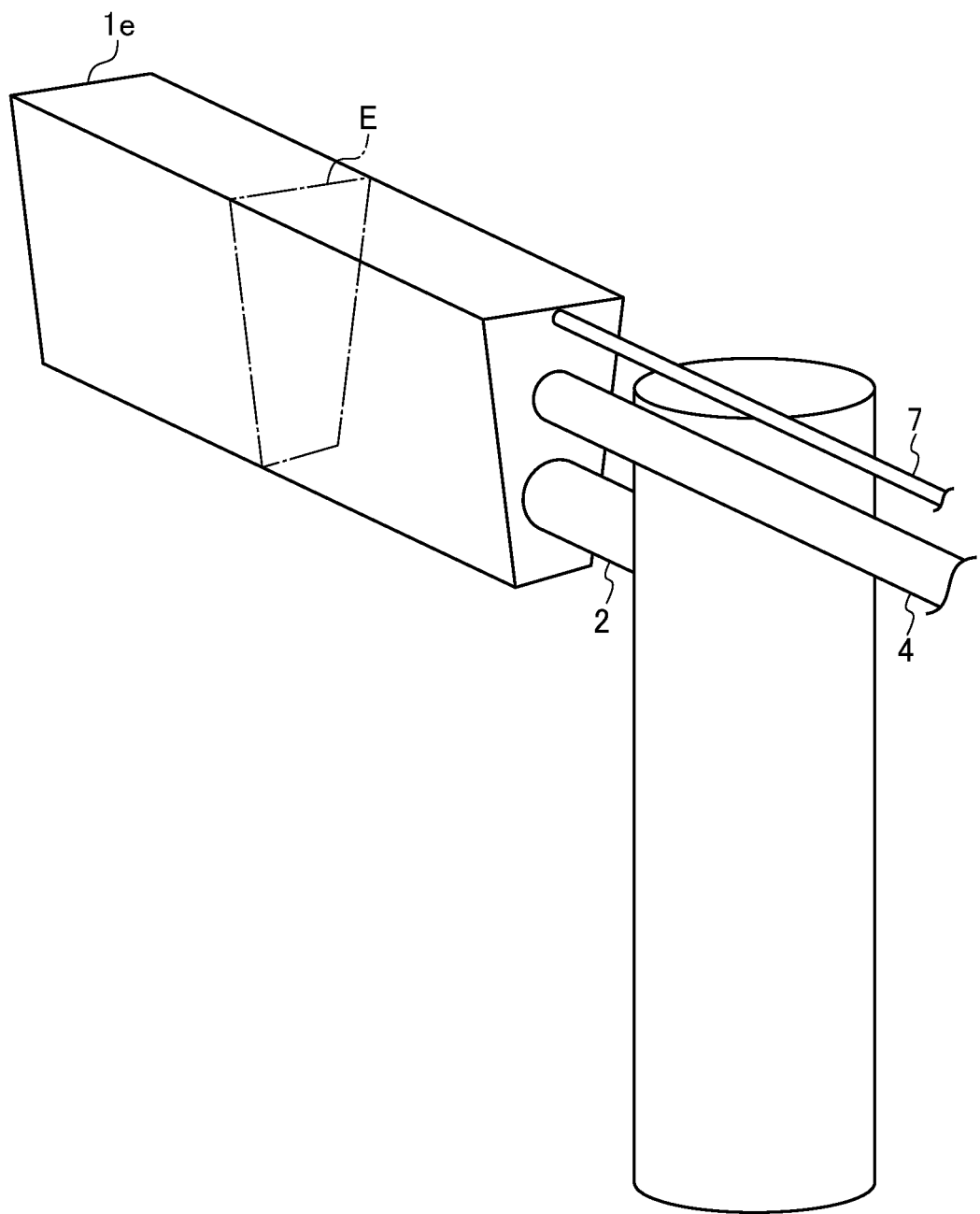
FIG. 12A is a schematic perspective view of a nozzle according to the fifth embodiment.
Figure 12B:
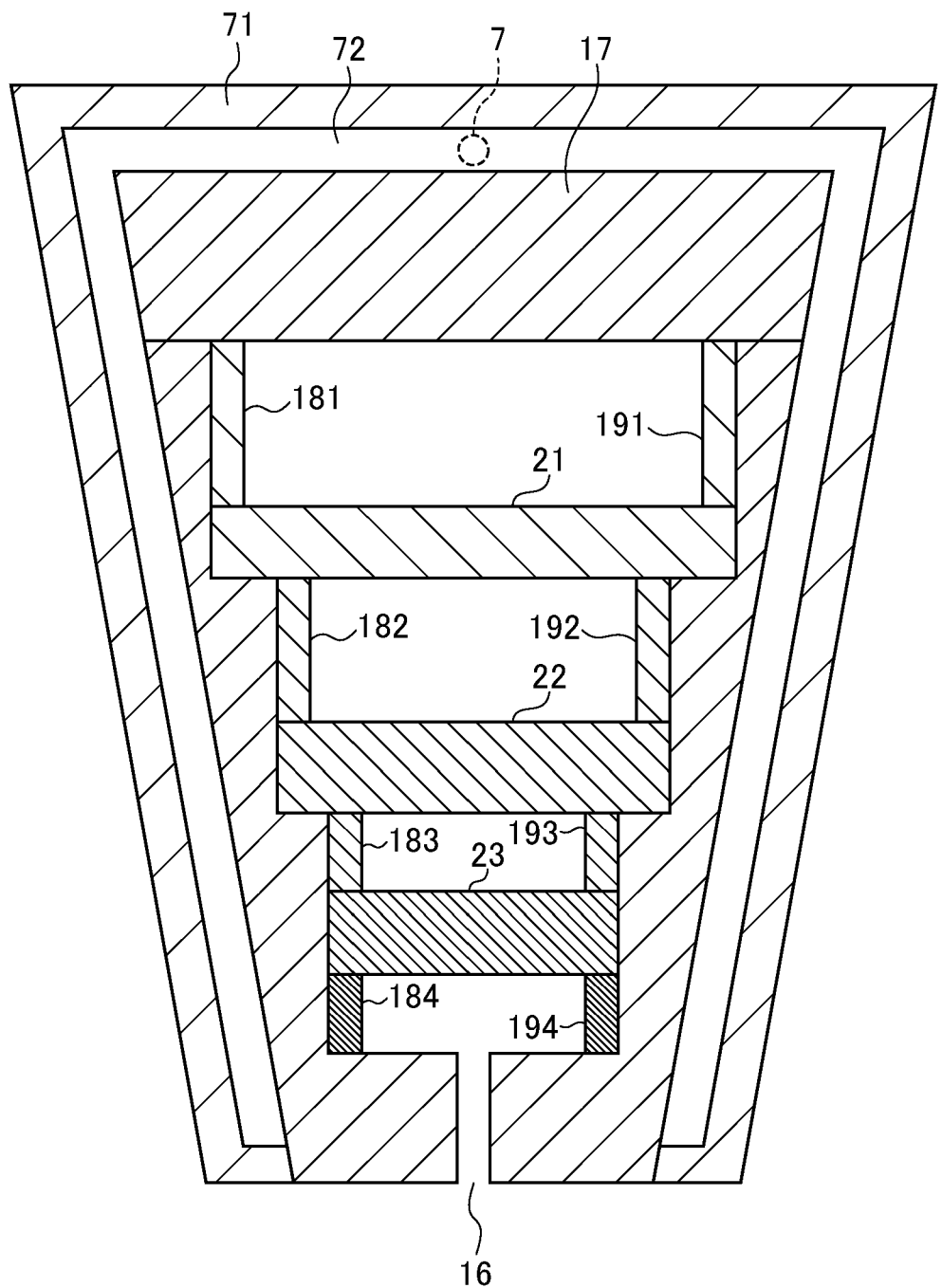
FIG. 12B is a cross-sectional view of the longitudinal section E in FIG. 12A.

A fifth embodiment will be then described. FIG. 12A is a schematic perspective view of a nozzle according to the fifth embodiment. FIG. 12B is a cross-sectional view of the longitudinal section E in FIG. 12A. In a nozzle 1e according to the fifth embodiment in FIG. 12A, a piping 7 for supplying a medium having a predetermined temperature or higher to the nozzle 1e is added to the nozzle 1 according to the first embodiment in FIG. 2A. The same reference numerals are used to designate the same components in FIGS. 2A and 2B, and a description thereof will be omitted.

In the fifth embodiment, the heating means is a medium (for example, liquid or gas) flowing through the surface of the housing 17 and having a temperature equal to or higher than a predetermined temperature. As illustrated in FIG. 12B, the housing 17 is partially covered with a flow path forming member 71, and the piping 7 communicates with a space 72 between the flow path forming member 71 and the housing 17. Thus, since the medium of a predetermined temperature or higher is supplied to the space 72 between the flow path forming member 71 and the housing 17, the surface of the housing 17 can be heated, and the liquid passing through the nozzle 1e can be heated.

Sixth Embodiment

Figure 13A:
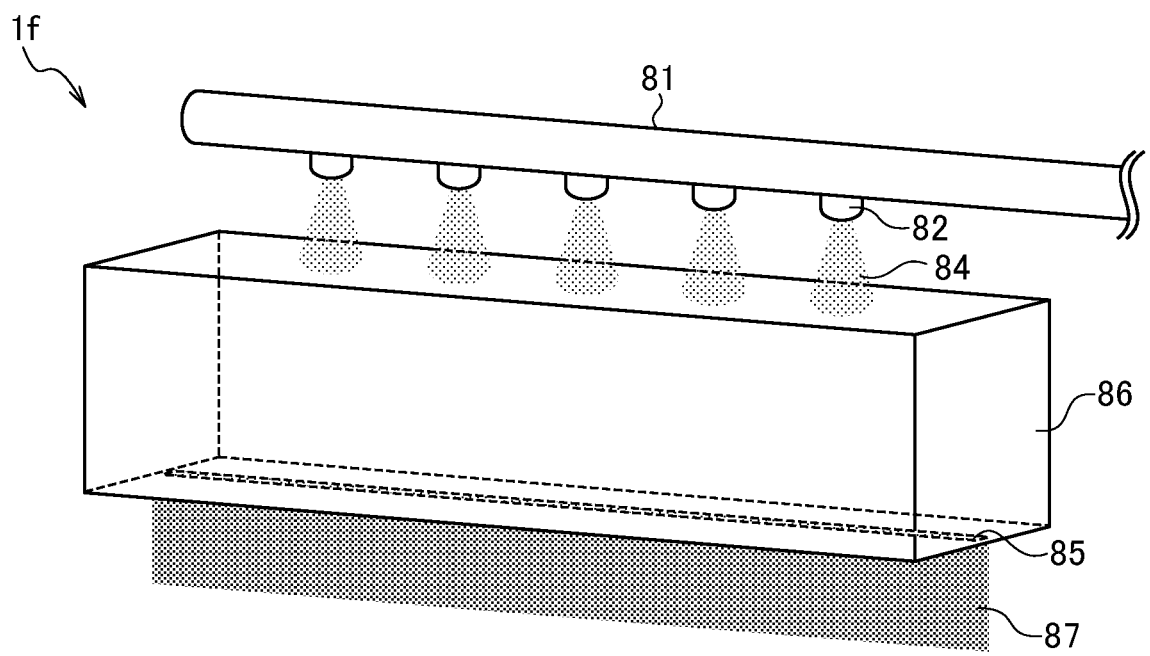
FIG. 13A is a schematic perspective view of a nozzle according to the sixth embodiment.

A sixth embodiment will be then described. FIG. 13A is a schematic perspective view of a nozzle according to the sixth embodiment. Compared with the nozzle 1 according to the first embodiment in FIG. 2A, a nozzle 1f according to the sixth embodiment includes a header pipe 81 to which a gas-dissolved liquid is supplied, a plurality of fine bubble generation nozzles 82 provided in the header pipe 81, and a rectifier means 86. The header pipe 81 communicates with the piping 4 in FIG. 1B, and the gas-dissolved liquid is supplied to the header pipe 81 through the piping 4. The plurality of fine bubble generation nozzles 82 generate and discharge a liquid containing fine bubbles from the gas-dissolved liquid supplied from the header pipe 81 as indicated by a discharge region 84 in FIG. 13A. The rectifier means 86 is provided with a slit 85 on the lower face of the rectifier means, and the liquid discharged from the fine bubble generation nozzle 82 is discharged from the slit 85 as indicated by a discharge region 87 in FIG. 13A. The rectifier means 86 has a structure in which the entire upper face is opened and a slit is provided on the lower face. In other words, the rectifier means 86 has a shape of a vessel, and a slit 85 is provided on the lower face of the rectifier means. The slit 85 is provided along the longitudinal direction of the rectifier means 86. Thus, the discharged liquid can be rectified in a row.

As described above, the nozzle 1f according to the sixth embodiment includes the header pipe 81 to which a gas-dissolved liquid is supplied, the plurality of fine bubble generation nozzles 82 for generating and discharging a liquid containing fine bubbles from the gas-dissolved liquid supplied from the header pipe 81, and the rectifier means 86 that is provided with the slit 85 and discharges the liquid discharged from the fine bubble generation nozzle 82 from the slit 85.

This configuration enables the uniformity in spraying the liquid containing the fine bubbles onto the substrate to be improved, since the liquid containing the fine bubbles is rectified and discharged uniformly.

Modification of Sixth Embodiment

Figure 13B:
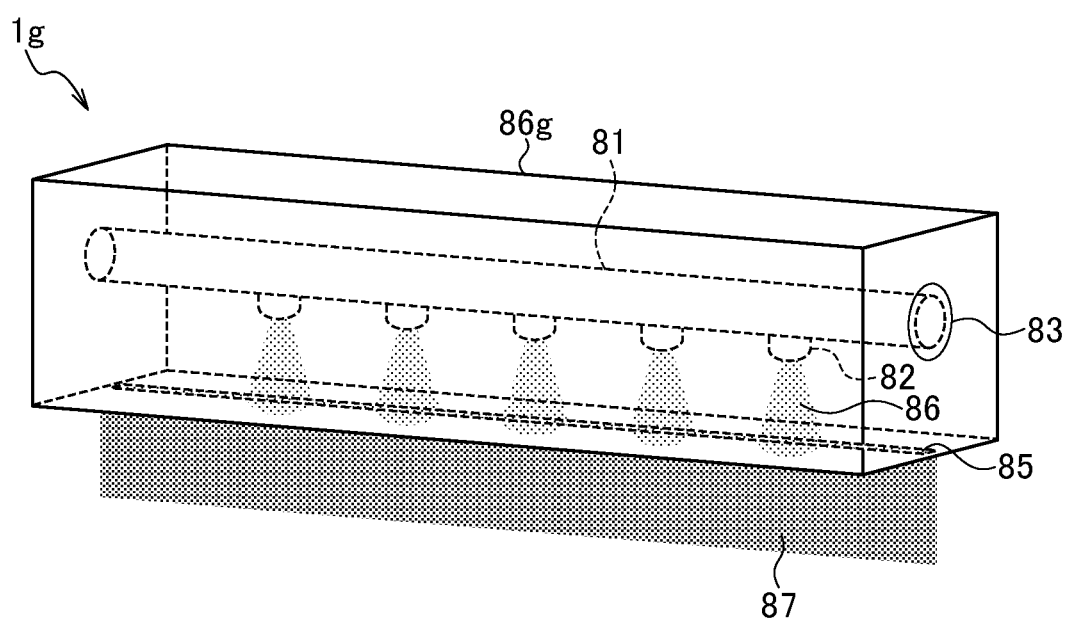
FIG. 13B is a schematic perspective view of a nozzle according to a modification of the sixth embodiment.

FIG. 13B is a schematic perspective view of a nozzle according to a modification of the sixth embodiment. As illustrated in FIG. 13B, the rectifier means 86*g* may be a housing that covers the header pipe 81 and the plurality of fine bubble generation nozzles 82. An opening 83 is formed in the end face of the rectifier means 86*g*, and the header pipe 81 is fixed to the opening 83 so that the inflow port of the end face of the header pipe 81 is fitted to the opening. The header pipe 81 communicates with the piping 4 in FIG. 1B, and the gas-dissolved liquid is supplied to the header pipe 81 through the piping 4. As indicated by the discharge region 86 in FIG. 13B, a liquid containing fine bubbles is generated and discharged from the gas-dissolved liquid supplied from the header pipe 81.

The rectifier means 86*g* is provided with the slit 85 on the lower face of the rectifier means, and the liquid discharged from the fine bubble generation nozzle 82 is discharged from the slit 85 as indicated by the discharge region 87 in FIG. 13B.

In this case, the upper face of the rectifier means 86*g* may or may not be an opening. Closing the upper face of the rectifier means 86*g* can prevent a part of the liquid from scattering outside a housing 17*g*. Further, when the upper face of the rectifier means 86*g* is not an opening, the direction of the fine bubble generation nozzle 82 attached to the opening 83 may be vertically upward. In this case, if the liquid passes through the slit 85 immediately after passing through the fine bubble generation nozzle 82, the liquid may not be possibly rectified into a uniform curtain shape, and thus the liquid is preferably adjusted so as to be slightly accumulated, since the liquid is less affected by the spray from the nozzle.

REFERENCE SIGNS LIST 1, 1*a*1, 1*a*2, 1*b*, 1*c*, 1*d*, 1*e*, 1*f* nozzle
10 substrate cleaning device
100 nozzle
101 header pipe
102 microbubble generation nozzle
110 nozzle
111 microbubble generation nozzle
112 header pipe
120 nozzle
121 microbubble generation nozzle
122 arm member
123 support
130 nozzle
131 microbubble generation nozzle
132 arm member
133 support
15 inflow port
16 slit
17, 17*a*, 17*b*, 17*d*, 17*g* housing
171, 171*a*, 171*b* top plate member
175, 175*a*, 175*b* supporting member
181, 182, 183, 184, 181*a*, 182*a*, 183*a*, 184*a*, 181*b*, 182*b*, 183*b*, 184*b* spacer
191, 192, 193, 194, 191*a*, 192*a*, 193*a*, 194*a*, 191*b*, 192*b*, 193*b*, 194*b* spacer
2 arm member
21, 21*a*, 21*b*, 21*c* plate
22, 22*a*, 22*b*, 22*c* plate
23, 23*a*, 23*b*, 23*c* plate
3 support
4 piping
41 electric heating member
5 wiring
51 infrared ray irradiator
52 arm member
6 piping
7 piping
71 flow path forming member
8 generator
81 header pipe
82 fine bubble generation nozzle
83 opening
85 slit
86 rectifier means
86*g* rectifier means
9 supporting member

What is claimed is:

1. A nozzle for generating fine bubbles, the nozzle comprising:
   a hollow housing; and
   a plurality of plates provided in the housing and partitioning the housing into a plurality of spaces, wherein
   an upper face or a side face of the housing is provided with an inflow port into which a gas-dissolved liquid flows and which communicates with an uppermost space of the spaces partitioned by the plate,
   each of the plates is provided with a plurality of through-holes, and
   a lower face of the housing is provided with a slit communicating with a lowermost space of the spaces partitioned by the plate.

2. The nozzle according to claim 1, wherein
   the plurality of plates has a second plate provided below a first plate of the plurality of plates, and
   the second plate has a larger number of through-holes than the first plate, and/or has through-holes smaller than and equal to the first plate.

3. The nozzle according to claim 1, comprising
   a heating means that heats the housing or the gas-dissolved liquid.

4. The nozzle according to claim 3, wherein
   the heating means is an electric heating member provided in the housing.

5. The nozzle according to claim 3, wherein
   the heating means is an infrared ray irradiator for irradiating the housing with infrared rays.

6. The nozzle according to claim 3, wherein
   the heating means is a medium flowing in the housing and having a predetermined temperature or higher.

7. The nozzle according to claim 3, wherein
   the heating means is a medium flowing through a surface of the housing and having a predetermined temperature or higher.

8. The nozzle according to claim 1, wherein
   the slit is provided along a longitudinal direction of the housing.

9. A nozzle comprising:

a header pipe to which a gas-dissolved liquid is supplied;

a plurality of fine bubble generation nozzles for generating and discharging a liquid containing fine bubbles from the gas-dissolved liquid supplied from the header pipe; and a rectifier means that is provided with a slit and discharges the liquid discharged from the fine bubble generation nozzle from the slit.

10. A substrate cleaning device comprising the nozzle according to claim 1.

* * * * *